US011699687B2

(12) United States Patent
Ahmed et al.

(10) Patent No.: US 11,699,687 B2
(45) Date of Patent: Jul. 11, 2023

(54) MICRO LIGHT-EMITTING DIODE DISPLAY DRIVER ARCHITECTURE AND PIXEL STRUCTURE

(71) Applicant: Intel Corporation, Santa Clara, CA (US)

(72) Inventors: Khaled Ahmed, Anaheim, CA (US); Kunjal Parikh, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 1293 days.

(21) Appl. No.: 15/962,965

(22) Filed: Apr. 25, 2018

(65) Prior Publication Data

US 2019/0335553 A1 Oct. 31, 2019

(51) Int. Cl.
| | |
|---|---|
| *H01L 25/075* | (2006.01) |
| *G02B 3/00* | (2006.01) |
| *H01L 29/786* | (2006.01) |
| *H01L 27/12* | (2006.01) |
| *H01L 29/24* | (2006.01) |

(52) U.S. Cl.
CPC ........ *H01L 25/0753* (2013.01); *G02B 3/0018* (2013.01); *G02B 3/0037* (2013.01); *H01L 27/1225* (2013.01); *H01L 29/24* (2013.01); *H01L 29/7869* (2013.01)

(58) Field of Classification Search
CPC . H01L 25/0753; H01L 27/1225; H01L 29/24; H01L 29/7869; G02B 3/0018; G02B 3/0037; H10K 59/10; H10K 59/12; H10K 10/20; H10K 2102/101
See application file for complete search history.

(56) References Cited

U.S. PATENT DOCUMENTS

| 5,386,158 A * | 1/1995 | Wang ..................... G11C 16/28 327/108 |
|---|---|---|
| 2003/0001673 A1* | 1/2003 | Kimura ................. H03F 1/3211 330/257 |
| 2006/0044072 A1* | 3/2006 | Kucharski ............... H01S 5/042 332/149 |
| 2007/0019306 A1 | 1/2007 | Wu et al. |
| 2007/0217019 A1 | 9/2007 | Huang et al. |
| 2015/0048865 A1* | 2/2015 | Lin ...................... H03K 3/0231 327/101 |
| 2016/0124027 A1* | 5/2016 | Sambucco ......... G01R 19/0092 324/76.11 |
| 2017/0200707 A1 | 7/2017 | Rogers et al. |

(Continued)

OTHER PUBLICATIONS

International Search Report and Written Opinion and Written Opinion from International Patent Application No. PCT/US2019/020364, dated Jun. 27, 2019,15 pages.

(Continued)

*Primary Examiner* — Brook Kebede
(74) *Attorney, Agent, or Firm* — Schwabe, Williamson & Wyatt P.C.

(57) ABSTRACT

Micro light-emitting diode display driver architectures and pixel structures are described. In an example, a driver circuit for a micro light emitting diode device includes a current mirror. A linearized transconductance amplifier is coupled to the current mirror. The linearized transconductance amplifier is to generate a pulse amplitude modulated current that is provided to a set of micro LEDs connected in parallel to provide fault tolerance architecture.

10 Claims, 15 Drawing Sheets

(56) References Cited

U.S. PATENT DOCUMENTS

2017/0287399 A1 10/2017 Ahmed et al.
2018/0035498 A1 2/2018 Rolindez et al.
2018/0061307 A1 3/2018 Inoue et al.

OTHER PUBLICATIONS

Preliminary Report on Patentability for International Patent Application No. PCT/US2019/020364, dated Nov. 5, 2020, 11 pages.

* cited by examiner

| | 4K 55" TV | Smartwatch | Smartphone | Consumer VR | AR |
|---|---|---|---|---|---|
| PPI | 80 | 250 | 600 | 1500 | 2000 |
| Subpixel Pitch | 106μm | 34μm | 14μm | 6μm | 4μm |

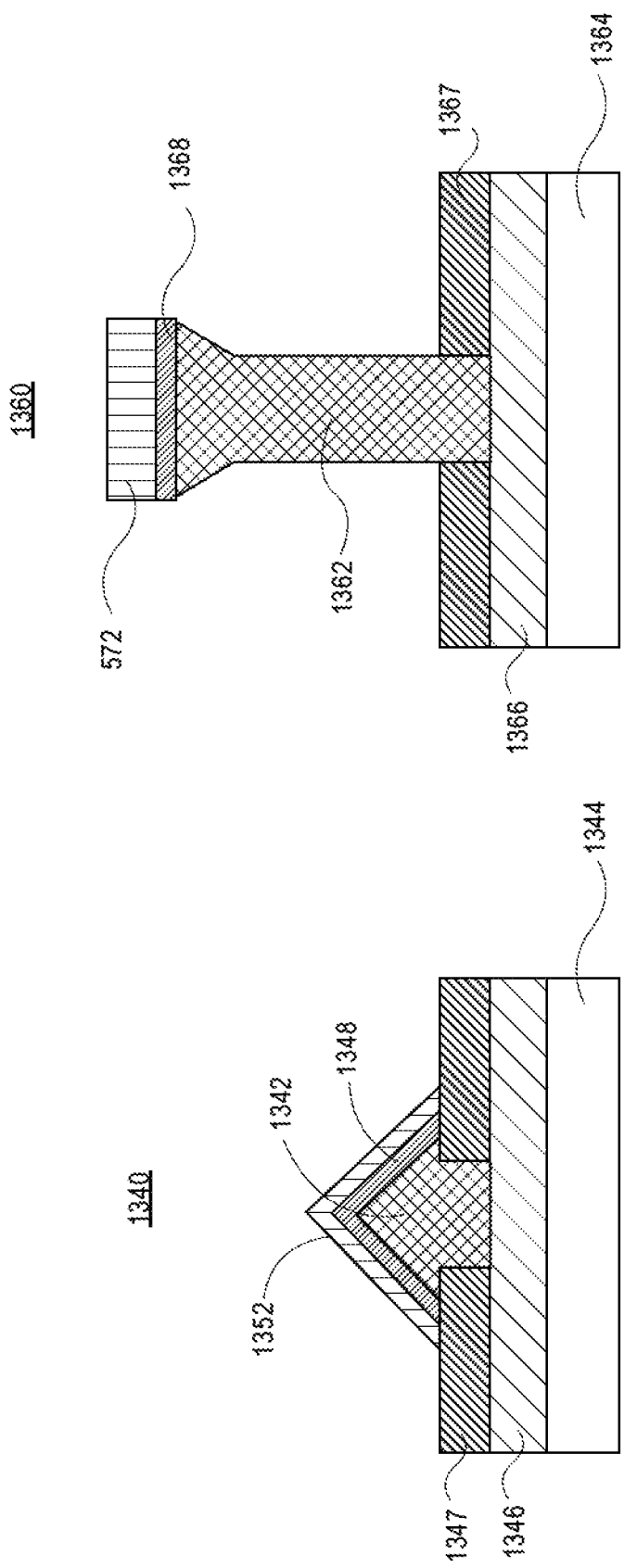

MICRO LIGHT-EMITTING DIODE DISPLAY DRIVER ARCHITECTURE AND PIXEL STRUCTURE

TECHNICAL FIELD

Embodiments of the disclosure are in the field of micro-LED displays and, in particular, micro light-emitting diode display driver architectures and pixel structures.

BACKGROUND

Displays having micro-scale light-emitting diodes (LEDs) are known as micro-LED, mLED, and µLED. As the name implies, micro-LED displays have arrays of micro-LEDs forming the individual pixel elements.

A pixel may be a minute area of illumination on a display screen, one of many from which an image is composed. In other words, pixels may be small discrete elements that together constitute an image as on a display. These primarily square or rectangular-shaped units may be the smallest item of information in an image. Pixels are normally arranged in a two-dimensional (2D) matrix, and are represented using dots, squares, rectangles, or other shapes. Pixels may be the basic building blocks of a display or digital image and with geometric coordinates.

BRIEF DESCRIPTION OF THE DRAWINGS

FIG. 13C illustrates a cross-sectional view of a GaN nanopyramid or micropyramid based LED highlighting certain layers of the LED, in accordance with an embodiment of the present disclosure.

FIG. 13D illustrates a cross-sectional view of a GaN axial nanowire based LED highlighting certain layers of the LED, in accordance with an embodiment of the present disclosure.

DESCRIPTION OF THE EMBODIMENTS

Figure 1:
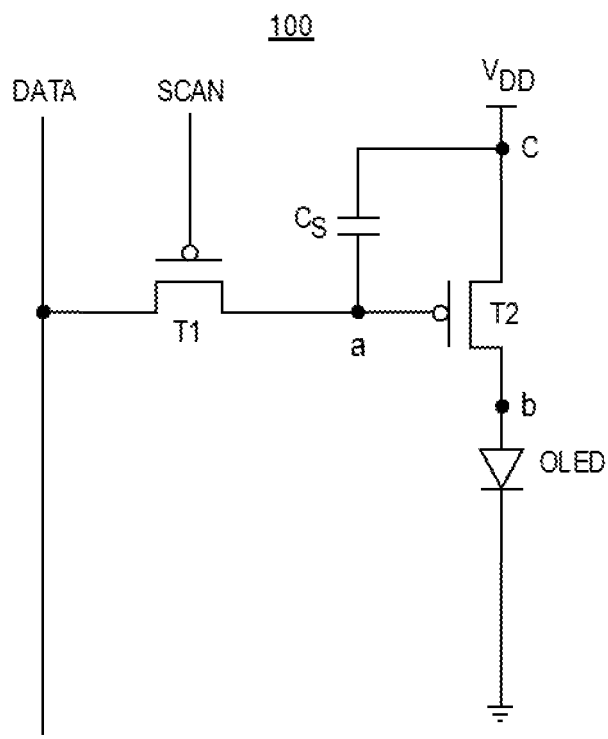
FIG. 1 is a circuit diagram of a circuit conventionally used for driving LED devices.

Micro light-emitting diode (LED) display driver architectures and pixel structures are described. In the following description, numerous specific details are set forth, such as specific material and structural regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

One or more embodiments described herein are directed to devices and architectures for micro LED displays. To provide context, displays based on inorganic micro LEDs (µLEDs) have attracted increasing attention for applications in emerging portable electronics and wearable computers such as head-mounted displays and wristwatches. Micro LEDs are typically first manufactured on Sapphire or silicon wafers (for example) and then transferred onto a display backplane glass substrate where on which active matrix thin-film transistors have been manufactured.

Micro LED displays promise 3×-5× less power compared to organic LED (OLED) displays. The difference would result in a savings in battery life in mobile devices (e.g., notebook and converged mobility) and can enhance user experience. In an embodiment, micro LED displays described herein consume two-fold less power compared to organic LED (OLED) displays. Such a reduction in power consumption may provide an additional approximately 8 hours of battery life. Such a platform may even outperform platforms based on low power consumption central processing units (CPUs). Embodiments described herein may be associated with one or more advantages such as, but not limited to, high manufacturing yield, high manufacturing throughput (display per hour), and applicability for displays with a diagonal dimension ranging from 2 inches to 15.6 inches.

In a first aspect of the present disclosure, display driver architectures using pulse amplitude modulation for micro LED displays are described.

One or more embodiments are directed to a system or method for driving a matrix of micro light emitting diode devices (μLEDs) in an active-matrix display. Displays based on inorganic micro LEDs (μLEDs) have attracted increasing attention for applications in emerging portable electronics and wearable computers such as head-mounted displays and wristwatches. Micro LED displays promise approximately 3× less power compared to OLED displays. The reduction in power consumption saves battery life in mobile devices and can enhance a user experience. It is to be appreciated that driving architecture described herein may also be used to drive micro OLED displays fabricated on complementary metal oxide semiconductor (CMOS) backplanes for virtual reality displays.

To provide background context, FIG. 1 is a circuit diagram of a circuit 100 conventionally used for driving LED devices. With reference to FIG. 1, for analog driving, a traditional two-transistor one-capacitor (2T1C) analog drive pixel circuit employs a first transistor (T1) as a switch. When SCAN is low, T1 is open, so a second transistor (T2) passes a current to the LED depending on the voltage level of a Data line. With reference again to FIG. 1, for digital driving, a traditional two-transistor one-capacitor (2T1C) digital drive pixel circuit employs both first and second transistors (T1 and T2) as switches. When SCAN is low, T1 is open, so T2 is turned on or off depending on the voltage level of a Data line. When SCAN is high, T2 is switched off, so the voltage level is held in $C_S$. The OLED pixel current has only two states: on and off. The pulsing of OLED current can be modulated by controlling SCAN and Data line by varying either the pulse width or density.

It is to be appreciated that, given a size of a LED in the range of 5 μm, the current required to drive a single LED for maximum luminance (e.g., 30-300 nits) is in the 1-100 nA range. Regarding state-of-the-art approaches, with respect to analog driving, the power efficacy of solid-state μLEDs drops significantly at very low current density (e.g., less than 1 A/cm$^2$). The drop in efficacy can cause undesired high power consumption.

Figure 2:
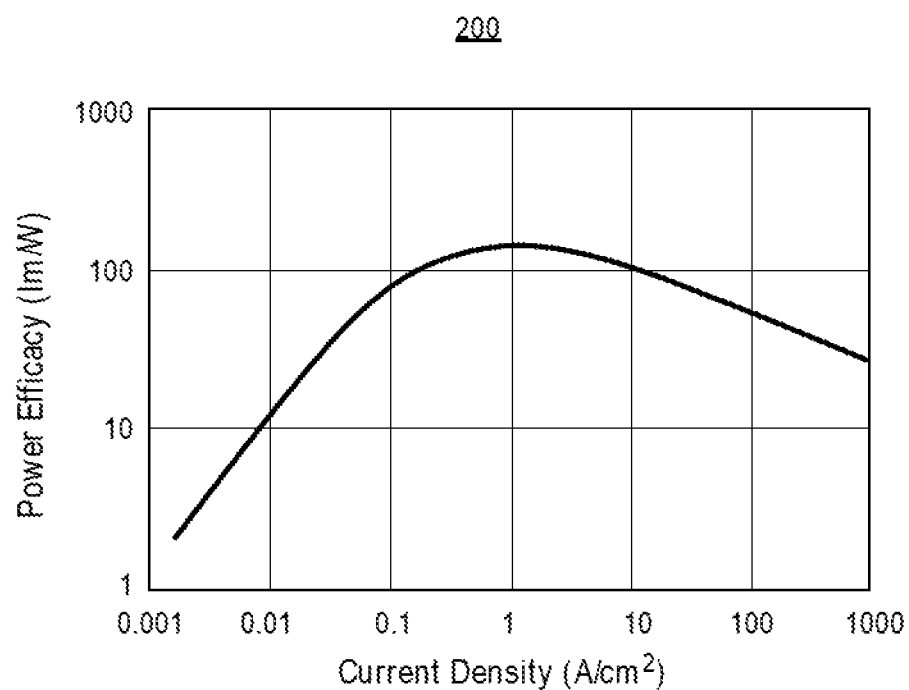
FIG. 2 is a plot of power efficacy as a function of current density for a green (InGaN/GaN) LED, in accordance with an embodiment of the present disclosure.

As an example of power efficacy versus current density, FIG. 2 is a plot 200 of power efficacy as a function of current density for a green (InGaN/GaN) LED, in accordance with an embodiment of the present disclosure. Referring to plot 200 of FIG. 2, power efficacy peaks at a current density of approximately 1 A/cm$^2$. However, typical operating conditions are current density are approximately 0.1 A/cm$^2$ for display applications. At such a low current level, the power efficacy is smaller than its optimal (peak) value. If the brightness demands forcing a current density that is smaller than approximately 1 A/cm$^2$ in this case, the LED will operate under sub-optimal conditions (i.e. lower power efficacy). Thus, potential brightness of the LED is not maximized.

Regarding state-of-the-art approaches, with respect to pulse width modulation digital driving, a false contour issue can be a major display quality concern. For pulse density modulation (PDM) digital driving, with respect to high pixel per inch (PPI) resolution displays, the pulse width can be less than 10 ns. This is comparable to the μLED response time and the PDM scheme can cease to work.

In accordance with an embodiment of the present disclosure, addressing one or more of the above described issues with state-of-the-art technologies, described herein is the use of pulse amplitude modulation to drive micro LEDs to achieve targeted brightness and power efficiency. In an embodiment, a circuit described herein is implemented for pulse amplitude modulation. In a particular embodiment, a μLED array is driven by a row and column driver. Each column driver has 8 bit SRAM and a 256 Bit digital to analog convertor (DAC). The output of the DAC is a pulse with an amplitude determined by the current density required to achieve peak power efficacy. The width of the pulse is a function of the integrated current density needed by the micro LED to achieve a desired gray level.

Advantages of implementing one or more embodiments described herein may include one or more of, but are not limited to: (1) a very low "average" current can be passed to μLEDs but the input current pulse amplitude can be large enough to improve circuit speed and operate at peak power efficacy of micro LEDs; (2) all transistors in the driver circuit may be operated in strong inversion operating regime, which is more stable and less vulnerable to variability; and/or (3) provision of a self-compensated circuit with respect to threshold voltage variation due to process variations and/or transistor instability.

One or more embodiments provide multiple knobs to control micro LED current at the nano-amp (nA) level without sacrificing speed (e.g., settling times) or display quality. Pulse amplitude modulation circuit architecture for pixel driving described herein may enable the removal of a limitation of pulse width associated with digital driving and, at the same time, may reduce the power associated with static power consumption of the DAC in the analog driving circuit architecture for a micro OLED.

To provide further context, LED arrays produce their own light in response to current flowing through the individual elements of the array. A variety of different LED-like luminescent sources have been used for such displays. One or more embodiments described herein utilize electroluminescent materials in μLEDs made of, for example, GaN, InGaN, or AlInGaP materials. Electrically, such devices behave like diodes with forward "on" voltage drops ranging from 1.9 volts (V) to 3 V, depending on the color.

Unlike liquid crystal displays (LCDs), μLEDs are current driven devices. However, they may be similarly arranged in a two-dimensional array (matrix) of elements to form a display. Active-matrix μLED displays typically use current control circuits integrated with the display itself, with one control circuit corresponding to each individual element on the substrate, to create high-resolution color graphics with a high refresh rate. Such a structure results in a matrix of devices, where one (or more) device is formed at each point where a row overlies a column. There will generally be at least M×N devices in a matrix having M rows and N columns. Typical devices function like light emitting diodes (LEDs), which conduct current and luminesce when voltage of one polarity is imposed across them, and block current when voltage of the opposite polarity is applied. To control such individual μLED devices located at the matrix junctions, it may be useful to have two distinct driver circuits, one to drive the columns and one to drive the rows. It is conventional to sequentially scan the rows (e.g., conventionally connected to device cathodes) with a driver switch to a known voltage such as ground, and to provide another driver to drive the columns (which are conventionally connected to device anodes). In operation, information is transferred to the matrix display by scanning each row in sequence. During each row scan period, each column connected to an element intended to emit light is also driven.

Figure 3A:
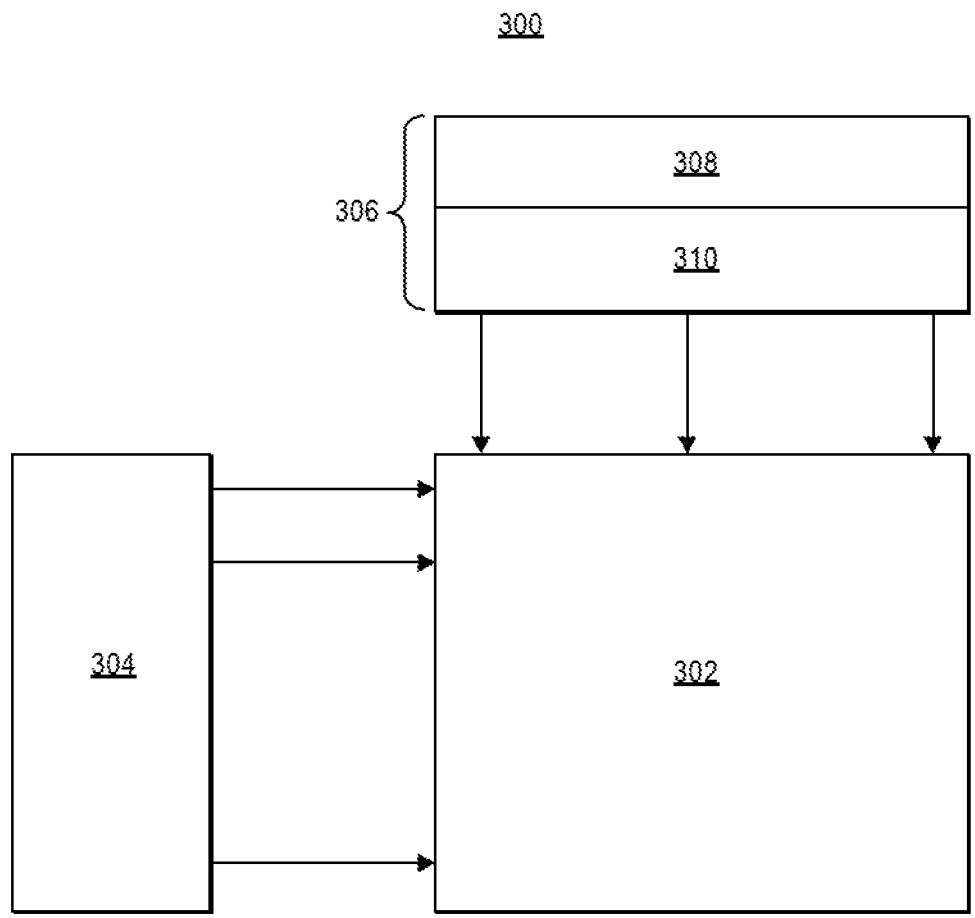
FIG. 3A is a block diagram of pulse amplitude modulation architecture, in accordance with an embodiment of the present disclosure.

In accordance with one or more embodiments of the present disclosure. A pulse amplitude modulation driving scheme and circuit are described. For example, FIG. 3A is a block diagram 300 of pulse amplitude modulation architecture, in accordance with an embodiment of the present disclosure. Referring to the display system schematic of FIG. 3A, a μLED array 302 (such as an OLED or LED) is driven by a row driver 304 and a column driver 306. Each column driver 306 will has 8 bit SRAM 308 and a 256 bit DAC or 10 bit PAM 310. The output of the DAC 310 is a pulse having an amplitude determined by the current density required to achieve peak power efficacy. The width of the pulse is a function of the integrated current density needed by the micro LED to achieve a desired gray level.

Figure 3B:
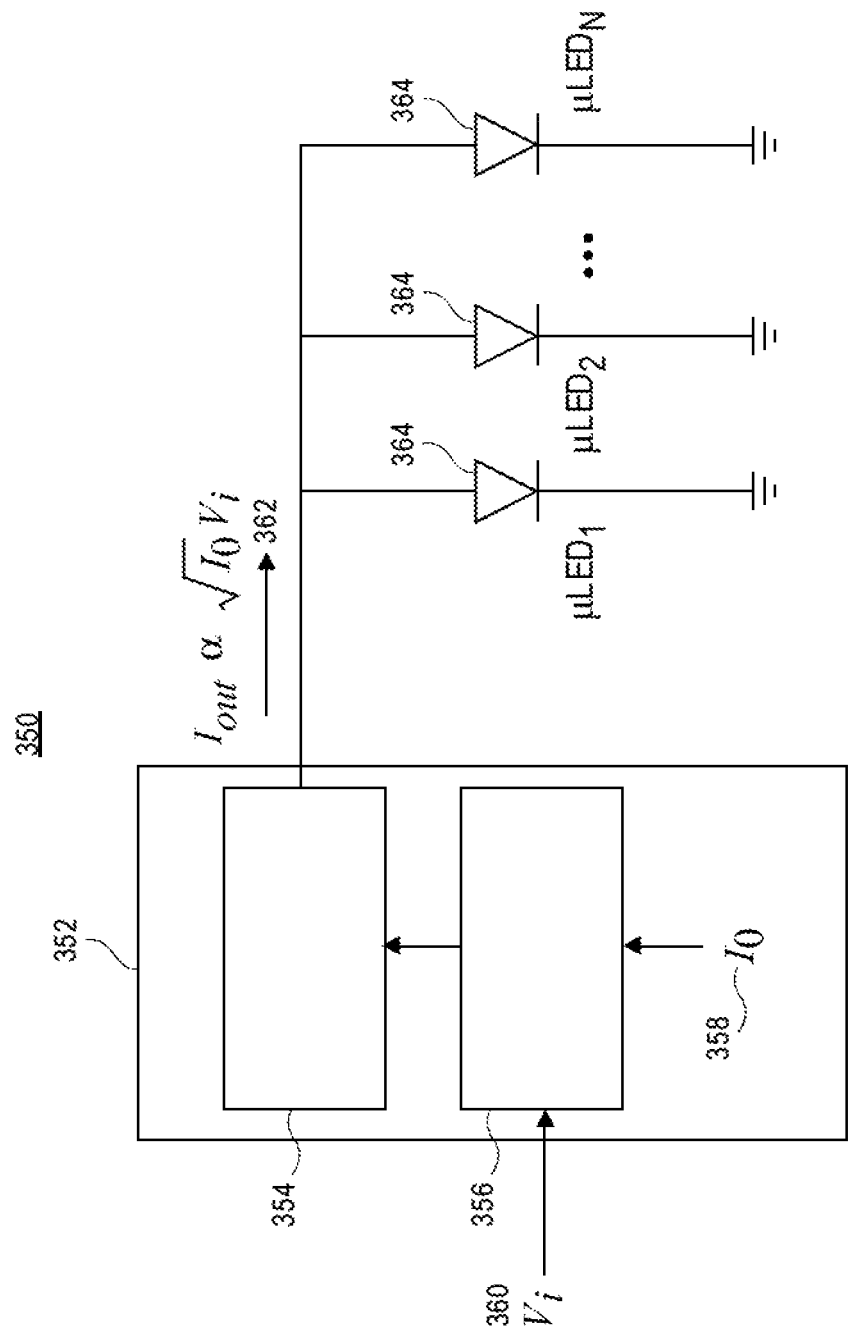
FIG. 3B is a block diagram of a pixel circuit including a linearized transconductance amplifier, in accordance with an embodiment of the present disclosure.

FIG. 3B is a block diagram of a pixel circuit including a linearized transconductance amplifier, in accordance with an embodiment of the present disclosure. Referring to FIG. 3B, a circuit 350 includes a pixel circuit 352. Pixel circuit 352 includes a current mirror 354 and a linearlized transconductance amplifier 356. A pulsed current source 358 is provided. Input data 360 is input to pixel circuit 352. Output data 362 is output from pixel circuit 352 and used to drive one or more micro LED devices 364.

Figure 4:
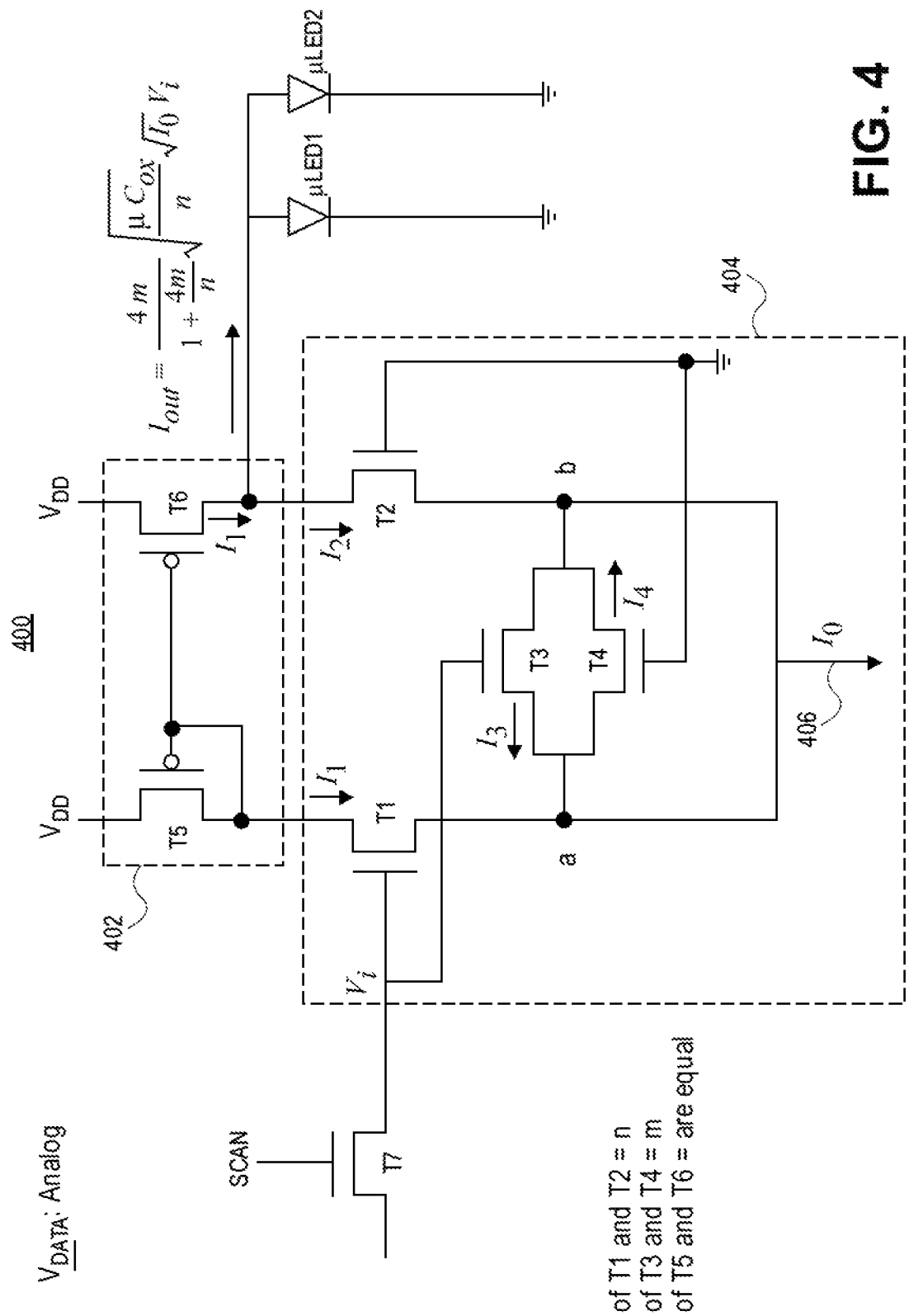
FIG. 4 illustrates a circuit for implementing pulse amplitude modulation, in accordance with an embodiment of the present disclosure.

FIG. 4 illustrates a circuit 400 for implementing pulse amplitude modulation, in accordance with an embodiment of the present disclosure. The circuit 400 includes a current mirror 402 and a linearized transconductance amplifier 404. In one embodiment, the current mirror 402 is based on two P-type transistors, as is depicted. In the pulse amplitude modulation circuit 400, an input voltage signal is driven by a DAC. The linearized transconductance amplifier 404 converts the voltage to current. At the bottom of circuit 400, the current itself gets switched to generate a pulse amplitude modulated current (e.g., bias current 406) as a pulsed current source. The width of the pulse is fixed by the amount of current density needed for representing a Gray level 1.

Regarding circuit analysis, referring again to the pulse amplitude modulation circuit 400 of FIG. 4, the following equations hold.

$$V_a = V_i - V_{GS1} = V_i - V_{TH} - \sqrt{\frac{2I_1}{\mu C_{ox} n}} \quad (1)$$

$$V_b = -V_{GS2} = -V_{TH} - \sqrt{\frac{2I_2}{\mu C_{ox} n}} \quad (2)$$

$$I_1 - I_2 = 2(I_3 - I_4) \quad (3)$$

-continued $$I_3 = m\mu C_{ox}\left[(V_i - V_b - V_{TH})V_{ab} - \frac{1}{2}V_{ab}^2\right] \quad (4)$$

$$I_4 = m\mu C_{ox}\left[(0 - V_a - V_{TH})V_{ba} - \frac{1}{2}V_{ba}^2\right] \quad (5)$$

$$I_1 = \frac{1}{2}I_0 + I_3 - I_4 = \frac{1}{2}I_0 + x \quad (6)$$

$$I_2 = \frac{1}{2}I_0 - I_3 + I_4 = \frac{1}{2}I_0 - x \quad (7)$$

Using equations (1)-(5), the following equation can be derived without any approximations.

$$I_3 - I_4 = \frac{nm}{n+4m}\sqrt{\frac{2\mu C_{ox}}{n}}\left(\sqrt{I_1} + \sqrt{I_2}\right)V_i \quad (8)$$

Using equations (6) and (7) into (8), the following is obtained.

$$x = \frac{nm}{n+4m}\sqrt{\frac{2\mu C_{ox}}{n}}\left(\sqrt{\frac{I_0}{2}+x} + \sqrt{\frac{I_0}{2}-x}\right)V_i \quad (9)$$

Solving the quadratic equation in x, the following equation is derived.

$$I_{out} = I_1 - I_2 = \frac{4m}{1+4m/n}\sqrt{\frac{\mu C_{ox}}{n}}\sqrt{I_0}\,V_i \quad (10)$$

Equation (10) is valid when the following condition is satisfied.

$$V_i \ll \frac{n+4m}{nm}\sqrt{\frac{n}{4}}\sqrt{\frac{I_0}{\mu C_{ox}}} \quad (11)$$

Combining equations (10) and (11) the following condition is determined.

$$I_0 \gg I_{out}/2 = 5I_{out} \quad (12)$$

In an embodiment, for a driving method, each of the gray levels is represented by a specific voltage ($V_i$) in equation (10). If V1 corresponds to the lowest gray level, and V10 corresponds to $1024^{th}$ gray level (e.g., in a 10-bit architecture), the DAC should provide voltage levels with resolution equal to (V10-V1)/1024 volts.

The highest gray level current is given by the following.

$$I_{GL,max} = I_{out}\frac{t_p}{1/(N_r f)} = \frac{I_0}{5}t_p N_r f \quad (13)$$

Thus, the current $I_0$ should be a pulse with fixed width ($t_p$) and amplitude that is equal to 5 $I_{GL,max}$ (($t_p \cdot f \cdot N_r$). Here, $I_{GL,max}$ is the micro LED current that corresponds to a highest gray level, f is the frame rate (e.g. 120 Hz), and $N_r$ is the number of rows in the active-matrix. The pulse amplitude should also equal to the current at which the micro LED power efficacy peaks ($J_p L^2$) where $J_p$ is the current density at peak power efficacy, and L is the size of the micro LED.
Therefore, the following holds.

$$J_p L^2 = 5 I_{GL,max}/(t_p \cdot f \cdot N_r) \qquad (14)$$

The pulse width can thus be determined to be the following.

$$t_p = 5 I_{GL,max}/(f \cdot N_r \cdot J_p \cdot L^2) \qquad (15)$$

In equation (15), $I_{GL,max}$ is the current corresponding to the highest gray level brightness. If it is assumed that $I_{GL,max}=10$ nA, f=120 Hz, $N_r=1440$, $J_p=1$ A/cm$^2$, and L=5 µm, then $t_p \approx 115$ µs.

In an embodiment, for pulse amplitude modulation, circuit 400 shown in FIG. 4 performs pulse amplitude modulation according to the following.

$$I_{out} = \frac{4m}{1+4m/n} \sqrt{\frac{\mu C_{ox}}{n}} \sqrt{I_0} \, V_i \qquad (16)$$

In equation (16), the pulse current ($I_0$) is modulated by the input DATA voltage $V_i$. The pulse height and pulse width $t_p$ are designed as described above.

In a second aspect of the present disclosure, an indium gallium zinc oxide (IGZO) thin film transistor (TFT) or IGZO-type TFT backplane for digital driving of micro LED displays is described.

To provide context, low temperature polysilicon (LTPS) backplanes are typically used in OLED displays, including those that are manufactured on flexible substrates. However, LTPS backplanes are expensive, in part, due to the large number of masks. Additionally, LTPS backplanes do not, at present, scale beyond sixth generation (1500×1850 cm) factories, thereby limiting cost reduction opportunities via scalability to larger backplanes which scale to tenth generation (2940×3320 cm) display factories.

In accordance with one or more embodiments of the present disclosure, as an alternative to an LTPS backplane, an IGZO TFT or IGZO-type TFT backplane is used. It is to be appreciated, however, that IGZO TFTs may be prone to threshold voltage shift under prolonged electrical stress. Additionally, current-voltage characteristics IGZO TFTs may change, which may alter the data current by more than 60% in a conventional pixel circuit. By contrast, in an embodiment, pixel circuits are used that provide a bulwark against threshold voltage shift in a µLED display. This enables the use of IGZO TFT or IGZO-type TFT backplanes. Such IGZO TFT or IGZO-type TFT backplanes may be more cost effective than LTPS TFT backplanes.

To provide further context, IGZO TFT backplanes used with conventional circuits based on two transistors and one capacitor circuit (e.g., as described above with respect to FIG. 1) do not provide a required compensation of the threshold voltage shift that results from prolonged usage. By contrast, in accordance with one or more embodiments described herein, a µLED or µOLED array is driven by a row and column driver. Each column driver has 8 bit SRAM and a 256 Bit DAC. The output of the DAC is the pulse with an amplitude determined by the current density required to achieve peak power efficacy. The width of the pulse is a function of the integrated current density needed by the micro LED to achieve a desired gray level and brightness.

In an embodiment, pixel circuits based on N-channel IGZO TFTs are used provide a bulwark against threshold voltage shift in a micro LED or micro OLED displays. The use of such N-channel IGZO TFTs enables the use of IGZO TFT or IGZO-type TFT backplanes that are cheaper compared to LTPS TFT backplanes. An exemplary IGZO-TFT pixel circuit design is described below in association with FIG. 6. An exemplary IGZO-TFT pixel structure that may be included in an LED display is described below in association with FIG. 7.

In an embodiment, advantages of implementing one or more embodiments described herein may include, but need not be limited to, one or more of (1) low manufacturing cost, (2) reliable displays, and/or (3) digital driving which provides low power consumption for micro LEDs. It is to be appreciated that demand for low power in consumer electronic devices has increased dramatically in the past ten years due to limited battery lifespan. One of the components with the highest percentage of total energy consumption, and therefore a suitable candidate for improvement, is the display. The developments of low power displays are becoming a high priority for the consumer electronics industry. Micro LED (µLED) display is a type of emissive display technology that uses a matrix of individually-switched self-illuminating inorganic diodes that can be controlled and lit without a master backlight. Inorganic µLEDs have a number of potential advantages over organic LEDs (OLEDs) for display applications including high brightness, longer lifecycle, and imperviousness to image sticking and burn in. Typically, in µLED displays, a desired color and luminance value are created from various combinations of three colors of light emitting elements (red, green and blue).

Figure 5:
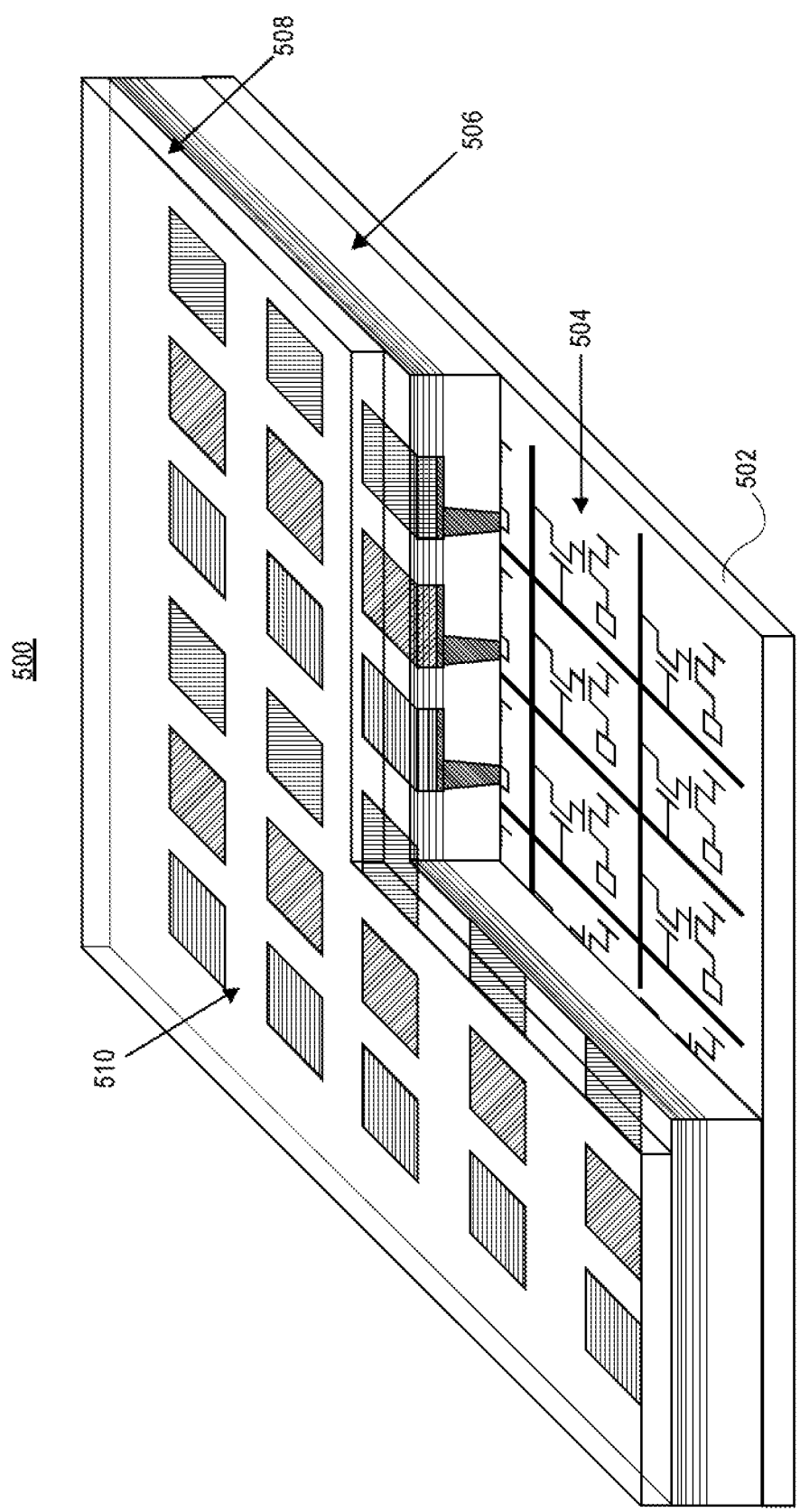
FIG. 5 illustrates a schematic of micro LED or OLED display architecture, in accordance with an embodiment of the present disclosure.

As an exemplary display architecture, FIG. 5 illustrates a schematic of micro LED or OLED display architecture, in accordance with an embodiment of the present disclosure. Referring to FIG. 5, a micro LED or OLED display 500 includes a backplane 502 having pixel circuits 504 thereon. An insulator 506 is over the pixel circuits 504. Micro LED layers 508 are included over the insulator 506. A transparent electrode 510 is over the micro LED layers 508. In one embodiment, pixel circuits 504 are described herein that are compatible with IGZO TFTs and IGZO-type TFTs.

To provide further context, since amorphous Indium-Gallium-Zinc-Oxide (a-IGZO) has been successfully employed in organic light-emitting diode (OLED) TV products, requirements of higher mobility and improved stability has become more stringent as OLED TVs move toward higher resolution, higher frame rate, higher brightness and longer lifetime. Manufacturability of amorphous oxide TFT on Generation 8 glass or even larger sizes of glass, which is a major advantage over low temperature poly-Si (LTPS) TFTs, has accelerated to develop more stable and higher mobility oxide TFTs. The improvements apply to not only OLED TVs but also to other applications that LTPS TFTs have dominated up to now. The IGZO TFT performance stability requirement becomes more stringent in display applications with higher resolution, higher frame rate, higher brightness, and longer target product lifetime. Current-driving TFTs in an OLED pixel are often under the influence of positive gate-bias temperature stress (PBTS). Under the influence of PBTS, the threshold voltage (VT) shifts in the positive direction. The physical origin of PBTS instability has been classified largely by a combination of (1) trapping of electrons in the gate insulator and (2) change in defect states in the IGZO channel region.

It is to be appreciated that process technology changes implemented to address the above issue can be complex and expensive, leading to higher manufacturing cost for IGZO-based TFT backplanes. As such, the apparent cost advantage of IGZO TFT compared to LTPS TFT backplanes may be reduced if additional or alternative processing is used that is relatively expensive. Alternatively, cost effective solutions may include the use of a compensation circuit design in order to meet both cost and reliability targets. Circuits described in accordance with embodiments herein may be implemented to provide a cost effective solution to meet lifetime requirements.

In accordance with one or more embodiments of the present disclosure, designs for pixel circuits driving OLEDs or micro LEDs are described based on circuits manufactured with IGZO TFTs. Designs described herein may address key challenges presently associated with in using IGZO TFTs, e.g., the threshold voltage shift under positive bias stress and example of which may be prolonged use under normal operating conditions of the display.

Figure 6:
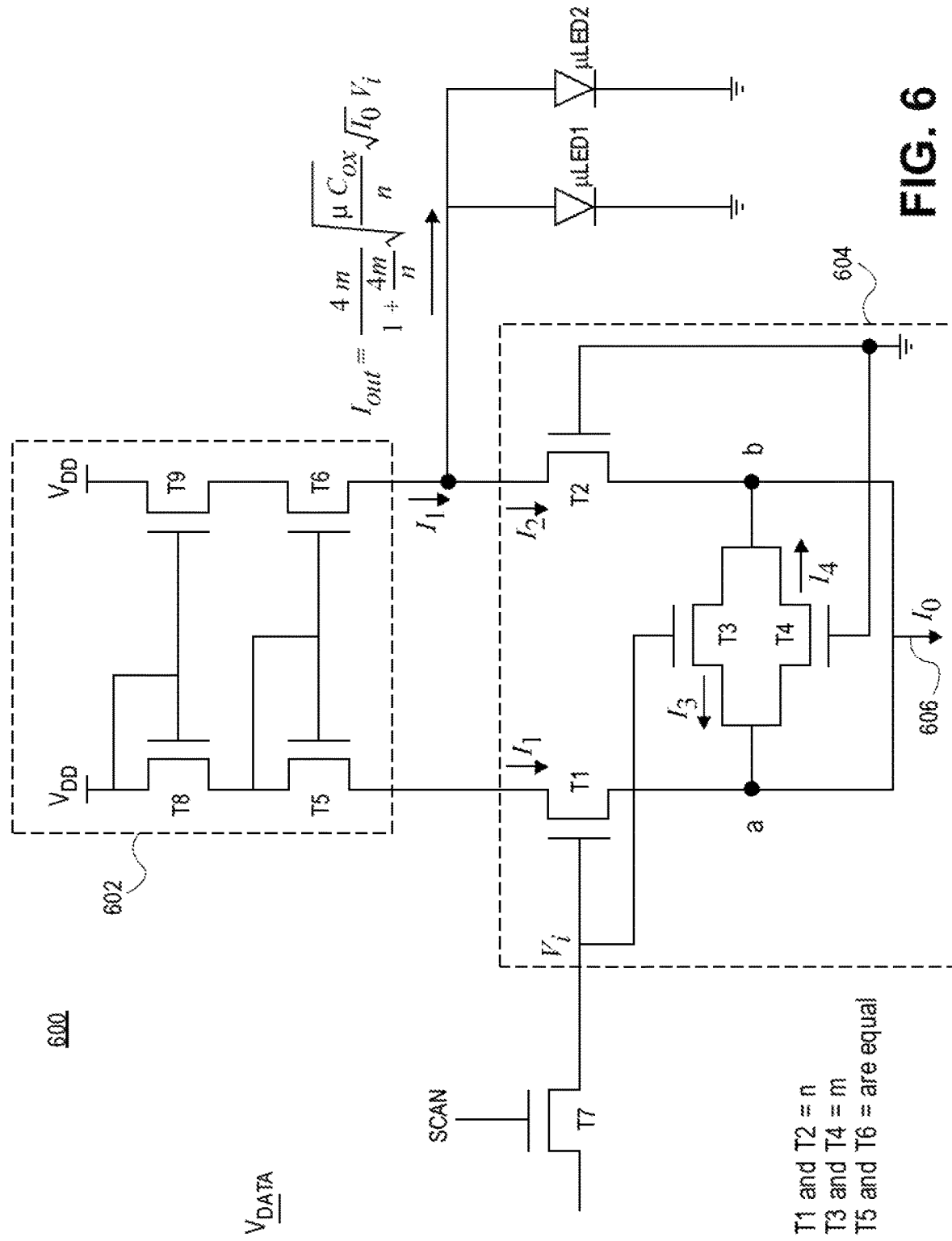
FIG. 6 illustrates a circuit compatible with IGZO-based TFT backplanes, in accordance with an embodiment of the present disclosure.

FIG. 6 illustrates a circuit 600 compatible with IGZO-based TFT backplanes, in accordance with an embodiment of the present disclosure. The circuit 600 includes a current mirror 602 and a linearized transconductance amplifier 604. In one embodiment, the current mirror 602 is based on four N-type transistors, as is depicted. In the circuit 600, an input voltage signal is driven by a DAC. The linearized transconductance amplifier 604 converts the voltage to current. At the bottom of circuit 600, the current itself gets switched to generate a pulse amplitude modulated current (e.g., bias current 606) as a pulsed current source. The width of the pulse is fixed by the amount of current density needed for representing the maximum Gray level. Regarding circuit analysis, referring again to the pulse amplitude modulation circuit 600 of FIG. 6, the above equations described in association with circuit 400 also hold for circuit 600.

In an embodiment, circuit 600 is referred to as an IGZO TFT pixel driving circuit. It is to be appreciated that in circuit 600 as shown in FIG. 6, in accordance with a specific embodiment, two micro LEDs are connected in parallel. However, it is to be appreciate that, in general, the number of micro LEDs driven by a circuit 600 may be one or more than two. As described above with respect to FIG. 3A, and as applicable for the architectures represented by circuit 600, a μLED array may be driven by a row and column driver. In one embodiment, each column driver may have 8 bit SRAM and a 256 Bit DAC. The output of the DAC is the pulse having an amplitude determined by the current density required to achieve peak power efficacy. The width of the pulse is a function of the integrated current density needed by the micro LED to achieve a desired gray level.

In a third aspect of the present disclosure, pixel structures for enhancing light extraction and controlling viewing angle for micro LED displays are described.

In accordance with one or more embodiments of the present disclosure, a device and method for fabricating full-color micro light emitting diode (μLED) displays with controllable viewing angle are described. It is to be appreciated that μLED displays promise 3×-5× less power compared to OLED displays. The result may translate into a savings in battery life in mobile devices (e.g., notebooks and converged mobility) and may enhance a user experience. Improvements in structures and fabrication processes are needed to realize low power, full color μLED displays, such as for displays described above in association with FIG. 5.

To provide context, state-of-the-art approaches to addressing one or more of the above issues include the use of a backplane having a "subpixel bank" designed to reflect light from a micro LED and help produce a desired viewing angle. However, drawbacks to implementing such an architecture may include high manufacturing cost, and the difficulty associated with the need for a special backplane design that is different from that used for OLED displays. Such a design, for example, may not be compatible with a nanowire micro LED design, such as described below, that can otherwise enable low display production cost and improve power reduction.

In accordance with one or more embodiments described herein, a subpixel bank layer is used on a display backplane to control a viewing angle. The subpixel bank layer thickness and angle can be used to adjust the display viewing angle. In the arrangement, μLED dies are positioned into the pixel bank by a transfer tool and connected by solder reflow or other processes. It is to be appreciated that more than one μLED of a same color can be placed in each bank if redundancy is required to mitigate risks of dead/malfunctioning pixels. In an embodiment, each pixel includes three subpixels: Red, Green, Blue (R,G,B). It is to be appreciated that other configurations with more subpixels are possible, for example R,G,B+Yellow. The physical size of the actual micro LED can be significantly smaller than that of the subpixel. In one embodiment, the pixel bank can occupy less than the available space allowed by the pixel pitch. It is to be appreciated that the micro LED can have various shapes, such as, but not limited to, square, rectangular or circular.

In an embodiment, the maximum dimension of the micro LED emitter is limited by the subpixel pitch, which may be one third of the pixel pitch in one direction. In an actual device, subpixel banks may be separated by at least 1-2 μm and the micro LED is smaller than the bank by at least 1 μm in order to allow for positioning tolerance. As a result, in accordance with one embodiment, the minimum micro LED dimension is typically less or equal to the subpixel pitch minus about 1.5-2 μm.

In accordance with one or more embodiments described herein, a microlens is implemented on top of each micro LED subsequent to transferring the micro LED from a donor wafer to a "standard" backplane. The microlens may assist to provide improved light extraction and control of a viewing angle. In an embodiment, such a microlens is fabricated using thermal reflow of photoresist, self-assembling of microspheres as microlenses, or ink-jet processing.

Figure 7:
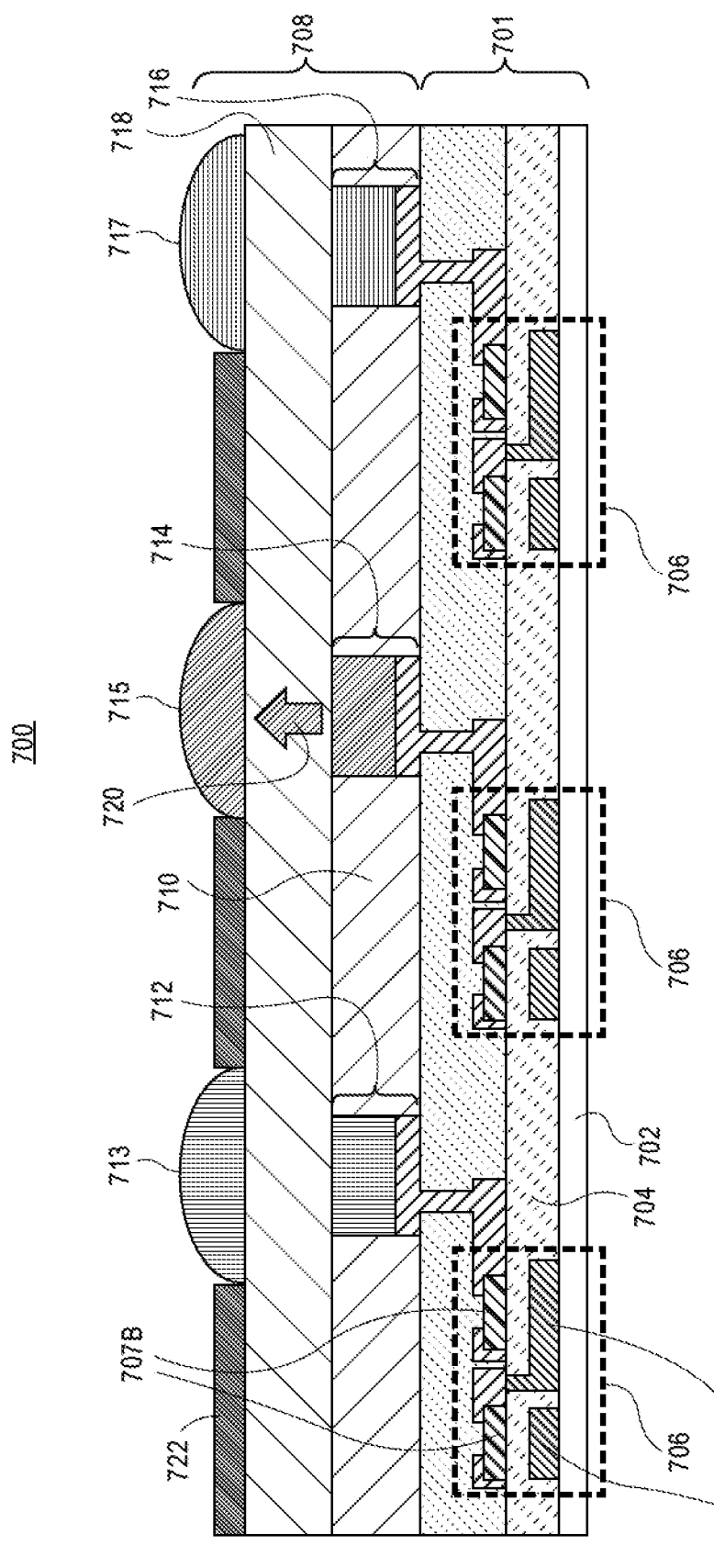
FIG. 7 illustrates a cross-sectional view of a pixel structure in accordance with an embodiment of the present disclosure.

As an exemplary pixel architecture, FIG. 7 illustrates a cross-sectional view of a pixel structure in accordance with an embodiment of the present disclosure.

Referring to FIG. 7, a pixel structure 700 includes a backplane 701. The backplane 701 includes a glass substrate 702 having an insulating layer 704 thereon. Pixel thin film transistor (TFT) circuits 706 are included in and on the insulating layer 704. Each of the pixel TFT circuits 706 includes gate electrodes 707A, such as metal gate electrodes, and channels 707B. A portion of the insulating layer 704 may act as a gate dielectric for each of the pixel TFT circuits 706.

Referring again to FIG. 7, the pixel structure 700 includes a front plane 708 on the backplane 701. The front plane 708 includes LEDs in a dielectric layer 710, such as a carbon-doped oxide layer. In an exemplary embodiment, three micro LEDs 712, 714 and 716 are included. In a particular embodiment, micro LED 712 is a red micro LED, micro LED 714 is a green micro LED, and micro LED 716 is a blue micro LED. It is to be appreciated that other arrangements may be used, including variation in number and/or colors of micro LEDs included.

Referring again to FIG. 7, the front plane 708 includes a transparent conducting oxide layer 718 as a cathode of the pixel structure 700. A mask layer 722, such as a layer of $CrO_2$, is on the conducting oxide layer 718. Microlenses, such as microlenses 713, 715 and 717 (associated with micro LEDs 712, 714 and 716, respectively), are disposed in openings in the mask layer 722 over an associated micro LED. In an embodiment, the arrangement provides for a collimated radiation pattern 720.

In an embodiment, each of the TFT circuits 706 is a circuit such as circuit 400 or 600 described above. Embodiments described herein may be based only on the back plane 701 described above. Embodiments described herein may be based only on the front plane 708 described above. Embodiments described herein may be based on a front plane that does not include microlenses.

In an embodiment, an LED pixel structure 700 with integrated microlenses on each micro LED can (1) enhance extraction efficiency, and (2) tune the viewing angle per each display application. Since the radiation pattern from a nanowire LED is almost collimated, the image and color quality may be readily preserved.

In an embodiment, the TFTs 706 are IZGO TFTs or IGZO-type TFTs, where the channel 707B of each of the TFTs 706 includes a semiconducting oxide material. In an embodiment, the semiconducting oxide material is an IGZO layer that has a gallium to indium ratio of 1:1, a gallium to indium ratio greater than 1 (e.g., 2:1, 3:1, 4:1, 5:1, 6:1, 7:1, 8:1, 9:1, or 10:1), or a gallium to indium ratio less than 1 (e.g., 1:2, 1:3, 1:4, 1:5, 1:6, 1:7, 1:8, 1:9, or 1:10). A low indium content IGZO may refer to IGZO having more gallium than indium (e.g., with a gallium to indium ratio greater than 1:1), and may also be referred to as high gallium content IGZO. Similarly, low gallium content IGZO may refer to IGZO having more indium than gallium (e.g., with a gallium to indium ratio less than 1:1), and may also be referred to as high indium content IGZO. In another embodiment, the semiconducting oxide material is or includes a material such as tin oxide, antimony oxide, indium oxide, indium tin oxide, titanium oxide, zinc oxide, indium zinc oxide, gallium oxide, titanium oxynitride, ruthenium oxide, or tungsten oxide.

In an embodiment, the semiconducting oxide material is an amorphous, crystalline, or semi crystalline oxide semiconductor, such as an amorphous, crystalline, or semi crystalline oxide semiconductor IGZO layer. The semiconducting oxide material may be formed using a low-temperature deposition process, such as physical vapor deposition (PVD) (e.g., sputtering), atomic layer deposition (ALD), or chemical vapor deposition (CVD). The ability to deposit the semiconducting oxide material at temperatures low enough to be compatible with back-end manufacturing processes represents a particular advantage. The semiconducting oxide material may be deposited on sidewalls or conformably on any desired structure to a precise thickness, allowing the manufacture of transistors having any desired geometry.

In an embodiment, gate electrode 707A includes at least one P-type work function metal or N-type work function metal. For a P-type transistors, metals that may be used for the gate electrode 707A may include, but are not limited to, ruthenium, palladium, platinum, cobalt, nickel, and conductive metal oxides (e.g., ruthenium oxide). For an N-type transistor, metals that may be used for the gate electrode 707A include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide).

Advantages of implementing embodiments described herein may include, but need not be limited to, providing a path to low manufacturing cost, which is accomplished by transferring the red-green-blue micro LED pixels in one pass from silicon wafer to a "standard" display backplane. Improved light extraction may be realized with the use of microlenses. A significant reduction in reflectivity may be achieved to provide enhanced transmission, which serves to assist with light extraction from the micro devices. A tunable radiation pattern may be accomplished by depositing micro lenses on red, green, and blue micro LEDs after transferring to a backplane and depositing the transparent conducting electrode (e.g., indium tin oxide (ITO)) to form the common cathode for all micro LEDs.

Figures 8, 9:
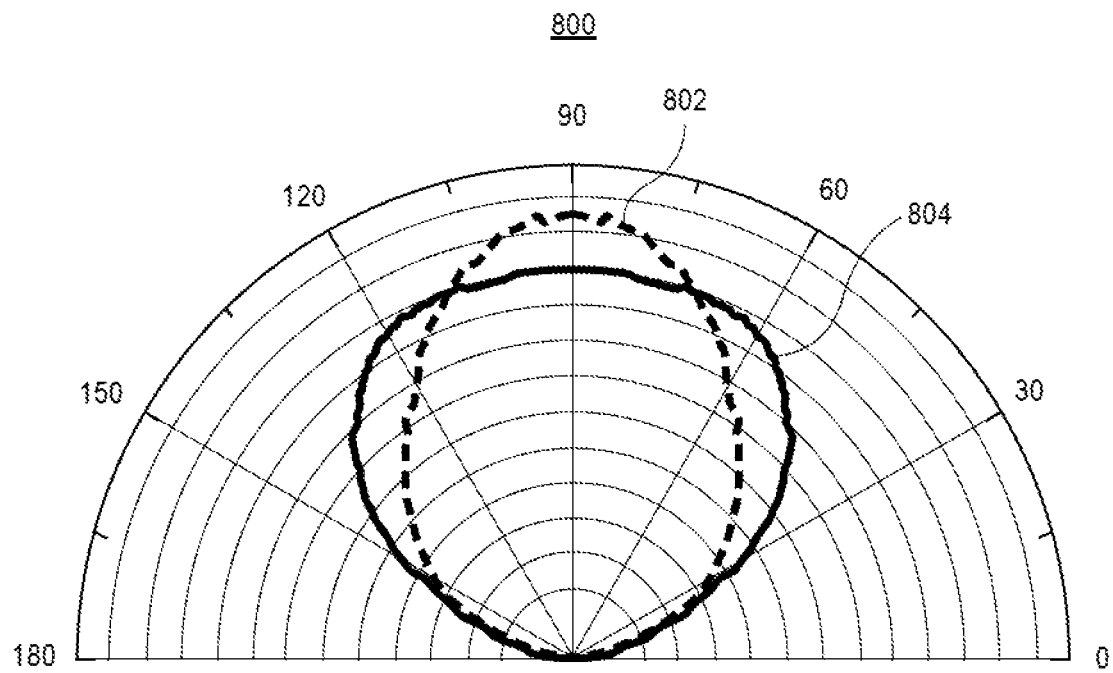
FIG. 8 a plot of emission patterns of a microlens-integrated micro LED, compared with a reference micro LED without a microlens, in accordance with an embodiment of the present disclosure.
FIG. 9 includes a Table summarizing typical subpixel sizes for different devices, in accordance with an embodiment of the present disclosure.

As an exemplary radiation pattern, FIG. 8 a plot 800 of emission patterns of a microlens-integrated micro LED 804, compared with a reference micro LED 802 without a microlens, in accordance with an embodiment of the present disclosure. Plot 800 provides an example of how a radiation pattern may be tuned using microlens integration on micro LEDs. In an embodiment, power reductions with micro LED displays may be achieved by the fabrication of LEDs with high power efficacies for the three color LED emitters. In one such embodiment, the use of a corresponding microlens provides for LEDs with high power efficacies.

Embodiments described herein may be implemented to enable large scale μLED display manufacturing that brings together three major separate technologies and supply chain bricks: (1) micro LED manufacturing, (2) display manufacturing, and (3) transfer technology tool manufacturing. In a typical display, each pixel is constituted of Red, Green and Blue (RGB) subpixels controlled independently by a matrix of transistors. The idea behind μLED displays is to use individual, small LED chips as the sub-pixel. Unlike OLEDs, inorganic LED require high processing temperatures (e.g., greater than 1000° C.) and cannot be "grown" and patterned directly on top of the transistor matrix. In most cases, the micro LED chips are therefore manufactured separately then positioned and connected to the transistor matrix via a pick and place process. Many companies and research organizations are currently working on μLED displays. However, volume production at costs compatible with the applications still face multiple engineering and manufacturing challenges. Such challenges include: LED epitaxy quality and homogeneity, efficiency of very small μLEDs, sidewall effects, massively parallel chip transfer technologies (e.g. pick and place) with position accuracy and high throughput, cost, handling of small die, etc., interconnects, color conversion, defect management, supply chain, and cost of production.

It is to be appreciated that due to the inorganic nature of the emitting materials of micro LEDs versus OLEDs, the efficiency and narrow emission bands of μLEDs also offer the prospect of significantly improved performance in terms of: energy consumption, color gamut, brightness, contrast (High Dynamic Range), long lifetime and environmental stability (not sensitive to air, moisture), and compatibility with flexible backplane technologies to enable curved or flexible displays. In addition, μLEDs can deliver extremely high pixel density (up to 5000 PPI) which, along with very high brightness, make them ideal for applications such as Augmented Reality (AR) or Head Up Display projectors.

In accordance with an embodiment of the present disclosure, for a display structure and backplane, the size of microlens is approximately the same as the size of the subpixel, e.g., as is shown in FIG. 7. In one embodiment, the RGB pixels are built directly upon the backplane that includes the transistor and capacitors to drive each individual subpixel. A micro LED is current driven and can use standard TFT LTPS or metal-oxide based backplane manufactured for the OLED industry on large dimension glass or flexible polymer substrates. In another embodiment, IGZO TFTs are used. For displays with very high pixel density, standard lithography and integration levels of TFT fabs may not be insufficient. FIG. 9 includes a Table 900 summarizing typical subpixel sizes for different devices, in accordance with an embodiment of the present disclosure.

In accordance with one or more embodiments of the present disclosure, a nanowire LED structure has a super-lambertian radiation pattern due to the LED contact structure. An exemplary LED structure is described below in association with FIG. 10. In one embodiment, light is created in the quantum well of the nanowire structure and reflected by a metal electrode.

Figure 10:
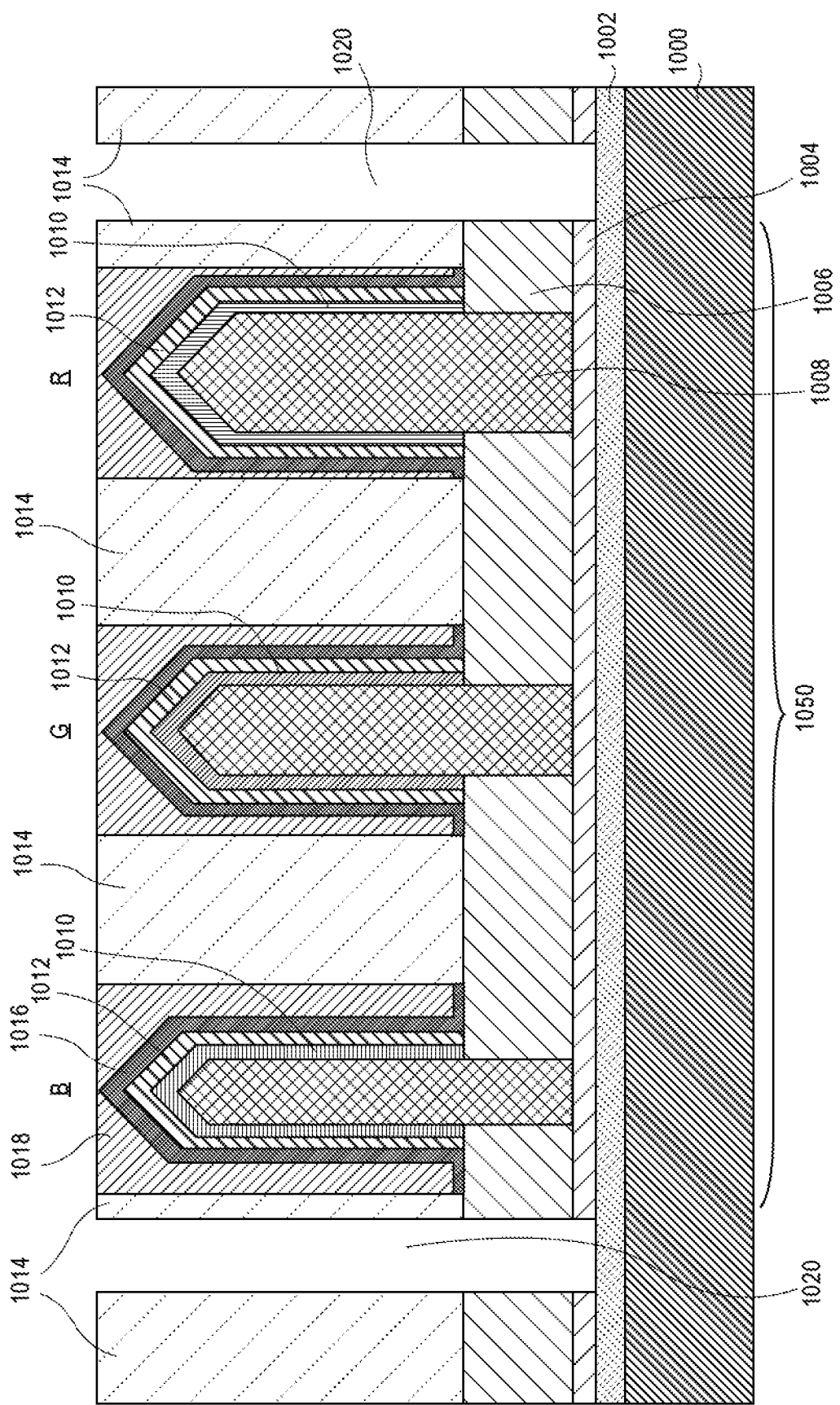
FIG. 10 illustrates a cross-sectional view of a red-green-blue pixel (an RGB pixel) with three nanowire LEDs, in accordance with an embodiment of the present disclosure.

As an exemplary structure, FIG. 10 illustrates a cross-sectional view of a red green blue pixel (an RGB pixel) with three nanowire LEDs, in accordance with an embodiment of the present disclosure. Referring to FIG. 10, although shown as three different color micro-LEDs across (e.g., blue, green, red from left-right), the three are shown in this manner for illustrative purposes only. It is to be appreciated that for a pixel such as a 2×2 pixel element, only two micro LEDs would be viewable for a given cross-section. It is to be appreciated that a variety of arrangements of micro LEDs may be suitable to make a single pixel. In one embodiment, three micro LEDs are arranged side-by-side, as depicted in FIG. 10. In another embodiment, four micro LEDs are arranged a 2×2 arrangement. In another embodiment, nine micro LEDs are arranged a 3×3 arrangement (three red micro LEDs, three green micro LEDs, and three blue micro LEDs), etc. It is to be appreciated that a micro LED is composed of an array of nanowire LEDs. The number of nanowire LEDs per one micro LEDs is at least one. For example, a 10 micron×10 micron micro LED may be composed of 90 nanowire LEDs connected in parallel to emit light of a specific color. It is further to be appreciated that, with respect to FIG. 10, the micro LEDs are represented by one nanowire each for illustrative purposes. This in general is not the case. Typically, one micro LED will be composed of more than one nanowire LED. Also, in FIG. 10, one example arrangement is shown. That is, the three colors are adjacent to each other. However, in some cases, the micro LEDs of different colors are separated on the source wafer by a distance that may be half of the display pixel pitch, for example.

With reference again to FIG. 10, in a particular embodiment, a source micro LED wafer 1000 (such as a silicon wafer) has "RGB Chips" monolithically grown thereon. The silicon wafer 1000 is first coated with an aluminum nitride (AlN) buffer layer 1002, e.g., having a thickness of approximately 50 nanometers. The AlN buffer layer 1002 may have a bandgap of about 6 eV and may be transparent to infrared radiation. A metal-based nucleation layer (MNL) 1004 is then deposited on the AlN buffer layer 1002. The MNL 1004 may have a thickness in the range of 30-100 nm and may be crystalline or polycrystalline. A silicon nitride mask 1006 is then deposited on the MNL. Lithography may then be used to open apertures in the silicon nitride mask 1006 mask with diameters carefully chosen to accommodate the subsequent formation of LEDs that emit red, green, and blue colors. N-type GaN nanowire cores are then grown, e.g., by metal organic chemical vapor deposition (MOCVD), as seeded from the MNL 1004. The nanowire cores may have diameters in the range 50 nm to 250 nm.

Referring again to FIG. 10, indium gallium nitride (InGaN) shells 1010 are grown around the GaN cores 1008, e.g., using MOCVD. The amount of indium in the InGaN shells 1010 depends on the GaN core diameter. In an embodiment, smaller core diameter result in the growth of InGaN shells with smaller indium content. Larger core diameters result in the growth of InGaN shells with larger indium content. For blue (B) color emission, the indium content is approximately 20%. For green (G) color emission, the indium content is approximately 30%. For red (R) color emission, the indium content is approximately 40%. A p-type GaN cladding layer 1012 may then be formed around the InGaN shells 1010, e.g., using MOCVD. The core-shell nanowires are the covered by an insulating material layer 1014, e.g., a silicon oxide (SiOx) layer. A lithography and etch may then be used to expose the p-GaN cladding layers 1012 for all color core-shell nanowire structures. Atomic layer deposition may then be used to conformally deposit a metal layer 1016 on the p-GaN cladding layers 1012. A metal fill process may then be performed to fill in contact metals 1018 for the micro LED structures.

Referring more generally to FIG. 10, a semiconductor structure includes a silicon wafer 1000 and plurality of pixel elements 1050. Each of the pixel elements 1050 includes a first color nanowire LED, a second color nanowire LED (the second color different than the first color), and a pair of third color nanowire LEDs (the third color different than the first and second colors). A continuous insulating material layer 1014 is laterally surrounding the first color nanowire LED, the second color nanowire LED, and the pair of third color nanowire LEDs. Adjacent pixel elements are separated from one another by a trench 1020 between corresponding continuous insulating material layers 1014. It is to be appreciated that more than three colors may be fabricated. For example, structures may be fabricated for red, green, yellow or blue emission. In another example, structures may be fabricated for red, orange, green, or blue emission.

In an embodiment, for each of the pixel elements 1050, the first color is red, the second color is green, and the third color is blue. In another embodiment, for each of the pixel elements 1050, the first color is red, the second color is blue, and the third color is green. In another embodiment, for each of the pixel elements 1050, the first color is blue, the second color is green, and the third color is red. In an embodiment, for each of the pixel elements 1050, the first color nanowire LED, the second color nanowire LED, and the pair of third color nanowire LEDs have a 2×2 arrangement. In another embodiment, a structure referred to as "monolithic blue and green only" may be fabricated. In such a case, three times as many blue micro LEDs as the green micro LEDs are fabricated. Then, after transfer of the blue and greed micro LEDs to the display backplane (at one shot of transfer), quantum dots are added on some of the blue micro LEDs to convert that blue to red color.

In an embodiment, an above described microlens used together with an LED structure of the type described in association with FIG. 10 enables realizing a wider viewing angle and improving the light extraction efficiency. In particular, light is generated in a InGaN/GaN quantum well and reflected by a contact metal. The radiation pattern is narrower than Lambertian. By integrating meta-lenses on the bottom of each micro LED (e.g., with red, green, or blue colors) a radiation pattern can be generated that meets the viewing angle required by the device under consideration.

Figure 11:
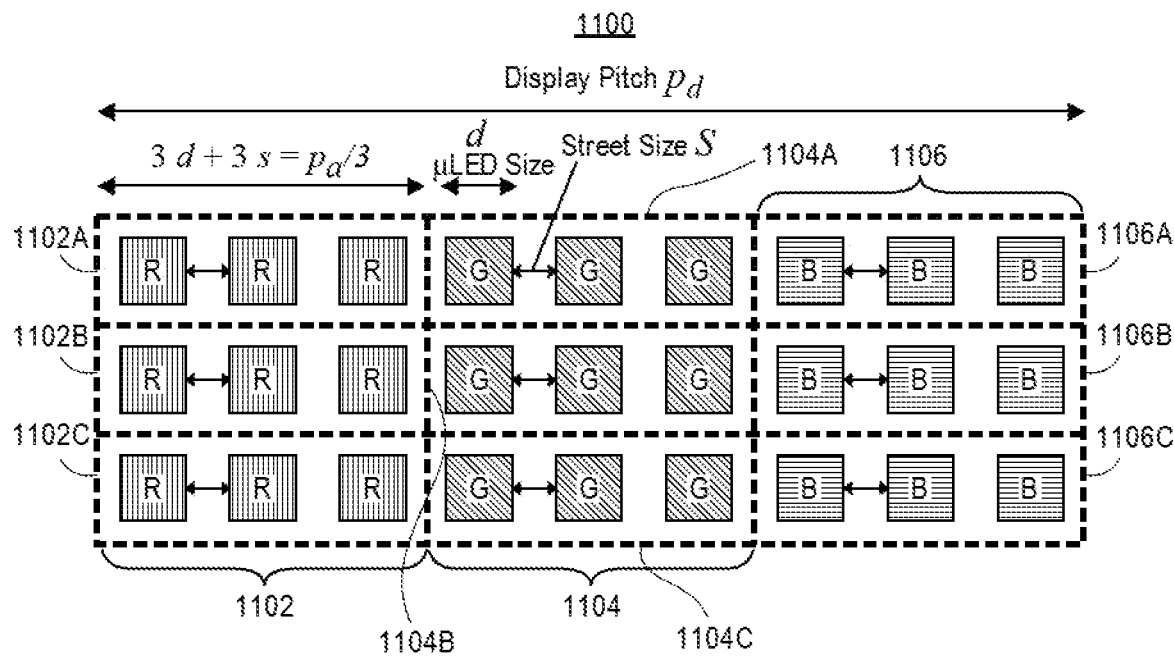
FIG. 11 is a top view schematic of a subpixel arrangement on a donor wafer, in accordance with an embodiment of the present disclosure.
Figure 12:
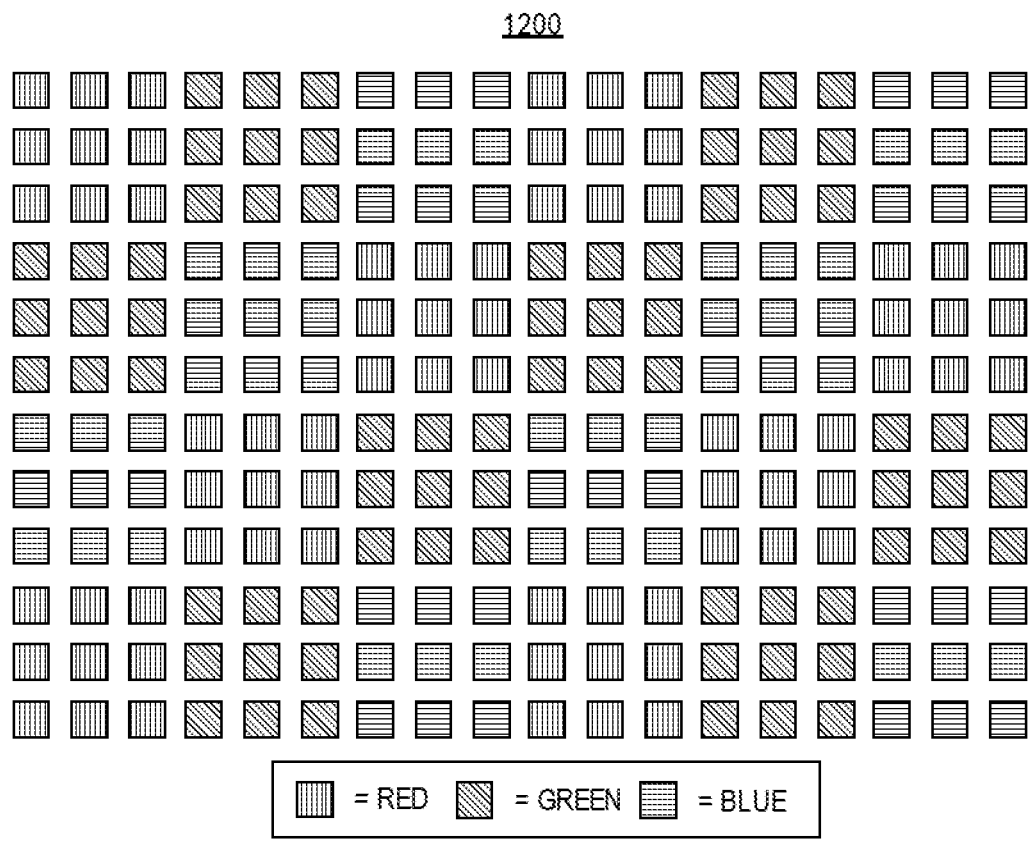
FIG. 12 is a "zoom out" view of FIG. 11 shown as an array for multiple pixels, in accordance with an embodiment of the present disclosure.

FIG. 11 is a top view schematic of a subpixel arrangement on a donor wafer, in accordance with an embodiment of the present disclosure. For example, a red block 1102 (shown to have groups 1102A, 1102B and 1102C), a green block 1104 (shown to have groups 1104A, 1104B and 1104C) and a blue block 1106 (shown to have groups 1106A, 1106B and 1106C) includes respective red, green, and blue subpixels separated by approximately one third of pixel pitch to guarantee no color mixing or bleeding when transferred to the display backplane. A "zoom out" is shown as array 1200 in FIG. 12 for multiple pixels, in accordance with an embodiment of the present disclosure.

In accordance with one or more embodiments of the present disclosure, addressing both cost and defectivity requirements, monolithic red, green and blue pixels are manufactured on a wafer and then transferred, as opposed to transferring individual micro LEDs with different colors from three separate source wafers sequentially. As described herein, source wafers are fabricated having individual red green blue (RGB) pixels (chips) thereon. Wafer-to-wafer bonding equipment and process technologies are then implemented to transfer micro LEDs from a source wafer to a target display backplane substrate, either directly or through an intermediate carrier plate. Thus, it is to be appreciated that typically three colors are transferred at the same time. It is not necessarily the case that "one RGB pixel" is transferred. Rather, it may be the case that one "whole" pixel is transferred. In another case, red, green, and blue micro LEDs are spaced appropriately on the wafer such that when they are transferred to the display backplane, they will land on pre-designated contact pads that may be separated by half of the pixel pitch or one quarter of the pixel pitch or other similar large enough spacing to prevent color bleeding.

To provide further context for embodiments described herein, major factors driving the growth of the GaN semiconductor device industry include the vast addressable market for GaN in consumer electronics and automotive, wide bandgap property of GaN material encouraging innovative applications, success of GaN in RF power electronics, and increasing adoption of GaN RF semiconductor device in military, defense and aerospace applications. GaN LEDs are widely used in laptop and notebook display, mobile display, projectors, televisions and monitor, signs and large displays, etc. The market for GaN-based power drives is expected to grow significantly during the forecast period attributed to its superior features such as minimum power loss, high-speed switching miniaturization, and high breakdown voltage as compared with the silicon-based power devices.

Figure 13A:
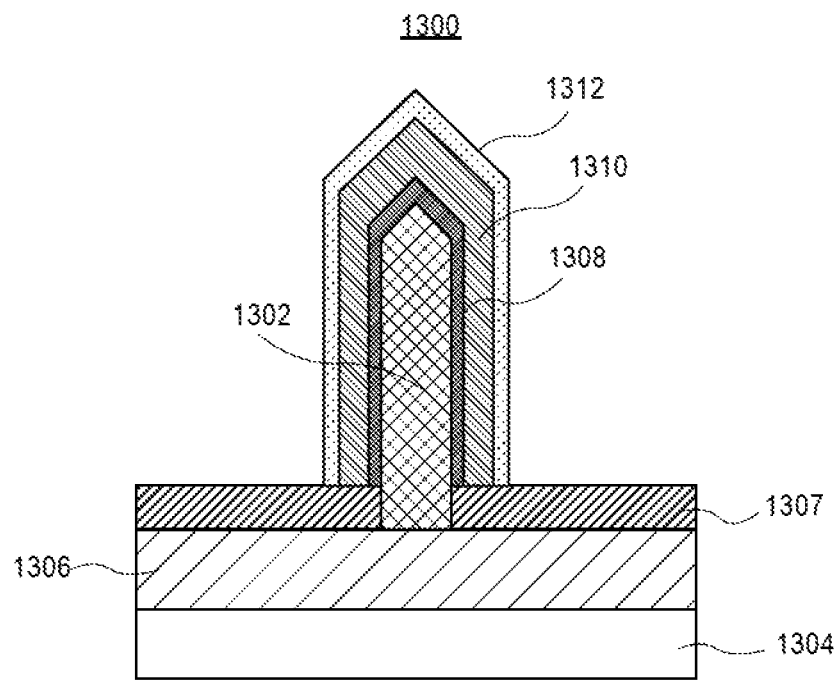
FIG. 13A illustrates a cross-sectional view of a GaN nanowire based LED highlighting certain layers of the LED, in accordance with an embodiment of the present disclosure.

FIG. 13A illustrates a cross-sectional view of a GaN nanowire based LED highlighting certain layers of the LED, in accordance with an embodiment of the present disclosure. In the exemplary embodiment of FIG. 13A, an LED 1300 includes an n-type GaN nanowire 1302 above a substrate 1304, which may be a Si(001) substrate. An intervening nucleation layer 1306 has an opened mask layer 1307 thereon. An active layer 1308/1310 (which may be a single active layer replacing 1308/1310) is included on the n-type GaN nanowire 1302. In a particular embodiment, an $In_{0.2}Ga_{0.8}N$ shell "buffer" layer 1308 is included on the n-type GaN nanowire 1302, and an active $In_{0.4}Ga_{0.6}N$ layer 1310 is included on the $In_{0.2}Ga_{0.8}N$ shell "buffer" layer 1308. In one such embodiment, the $In_{0.4}Ga_{0.6}N$ layer 1310 emits red color (e.g., having a wavelength in the range of 610-630 nanometers). A p-GaN or p-ZnO cladding layer 1312 is included on the active layer 1308/1310.

In another such embodiment, following the fabrication of an ordered n-type $In_xGa_{1-x}N$ nanowire array with x in the range of 0.15-0.25, the remainder of the LED structure is grown radially around the nanowires. An $In_yGa_{1-y}N$ layer is on the $In_xGa_{1-x}N$ nanowires (and may be included in a set of $In_yGa_{1-y}N$/GaN multi-quantum well (MQW) active layers) with y in the range of 0.4-0.45. An undoped GaN layer and/or AlGaN electron blocking layer may be included as the next outer layer. Finally, a p-type GaN (or p-type ZnO) cladding layer may be included.

Figure 13B:
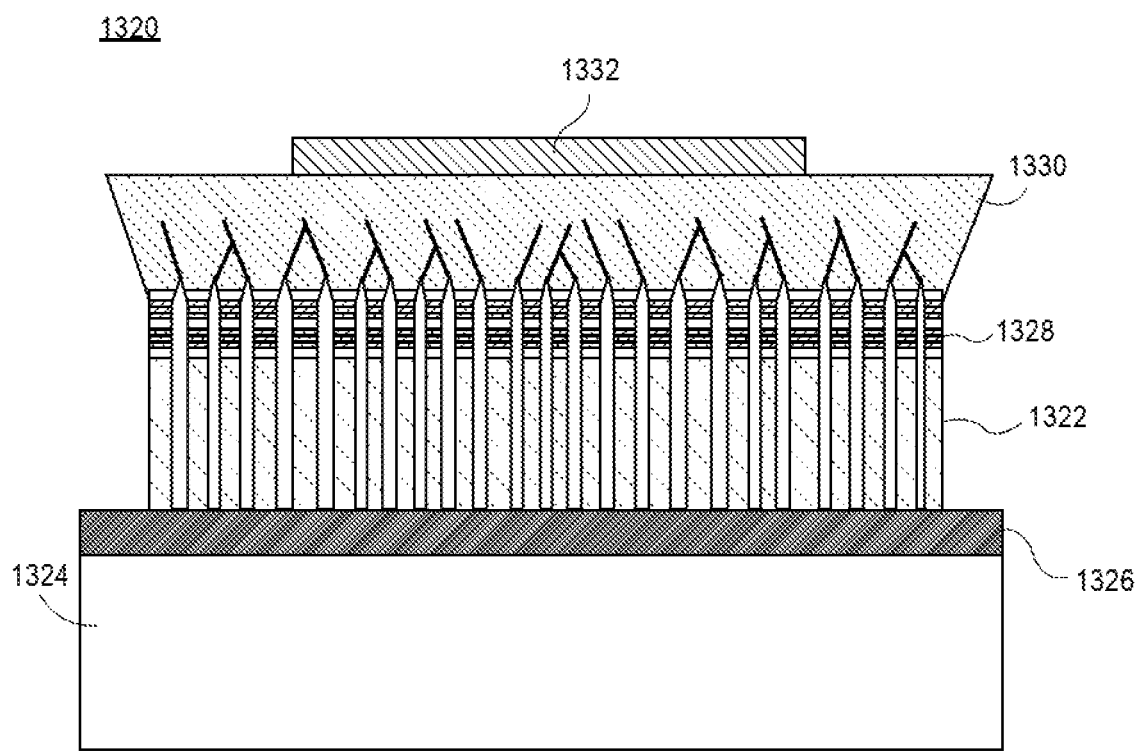
FIG. 13B illustrates a cross-sectional view of a micro-LED composed of multiple nanowire LEDs, in accordance with an embodiment of the present disclosure.

FIG. 13B illustrates a cross-sectional view of a micro-LED composed of multiple nanowire LEDs, in accordance with an embodiment of the present disclosure. In the exemplary embodiment of FIG. 13B, a micro-LED 1320 includes an n-GaN nano-column 1322 above a substrate 1324, which may be a Si(001) substrate. An intervening nucleation layer 1326 is included between the n-GaN nano-column 1322 and the substrate 1324. An InGaN/GaN multi-quantum well device (MQD) stack 1328 is included on the n-GaN nano-column 1322. A p-GaN layer 1330 is on the multi-quantum well device (MQD) stack 1328. A transparent p-electrode 1332 is included on the p-GaN layer 1330.

It is to be appreciated that foundational geometries other than the above described nanowires may be used for LED fabrication. For example, in another embodiment, FIG. 13C illustrates a cross-sectional view of a GaN nanopyramid or micropyramid based LED highlighting certain layers of the LED, in accordance with an embodiment of the present disclosure. In the exemplary embodiment of FIG. 13C, an LED 1340 includes an n-GaN nanopyramid 1342 above a substrate 1344, which may be a Si(001) substrate. An intervening nucleation layer 1346 has an opened mask layer 1347 thereon. An InGaN layer 1348 is included on the GaN nanopyramid 1342. A p-GaN or p-ZnO cladding layer 1352 is included on the InGaN layer 1348. It is to be appreciated that a micro LED may be composed of multiple nanopyramids connected in parallel. For example, a 5 um×5 um micro LED may be composed of 20 nanopyramids.

In another embodiment, FIG. 13D illustrates a cross-sectional view of a GaN axial nanowire based LED highlighting certain layers of the LED, in accordance with an embodiment of the present disclosure. In the exemplary embodiment of FIG. 13D, an LED 1360 includes an n-GaN axial nanowire 1362 above a substrate 1364, which may be a Si(001) substrate. An intervening nucleation layer 1366 has an opened mask layer 1367 thereon. An InGaN layer 1368 is included on the GaN axial nanowire 1362. A p-GaN or p-ZnO cladding layer 1372 is included on the InGaN layer 1368.

Figure 14:
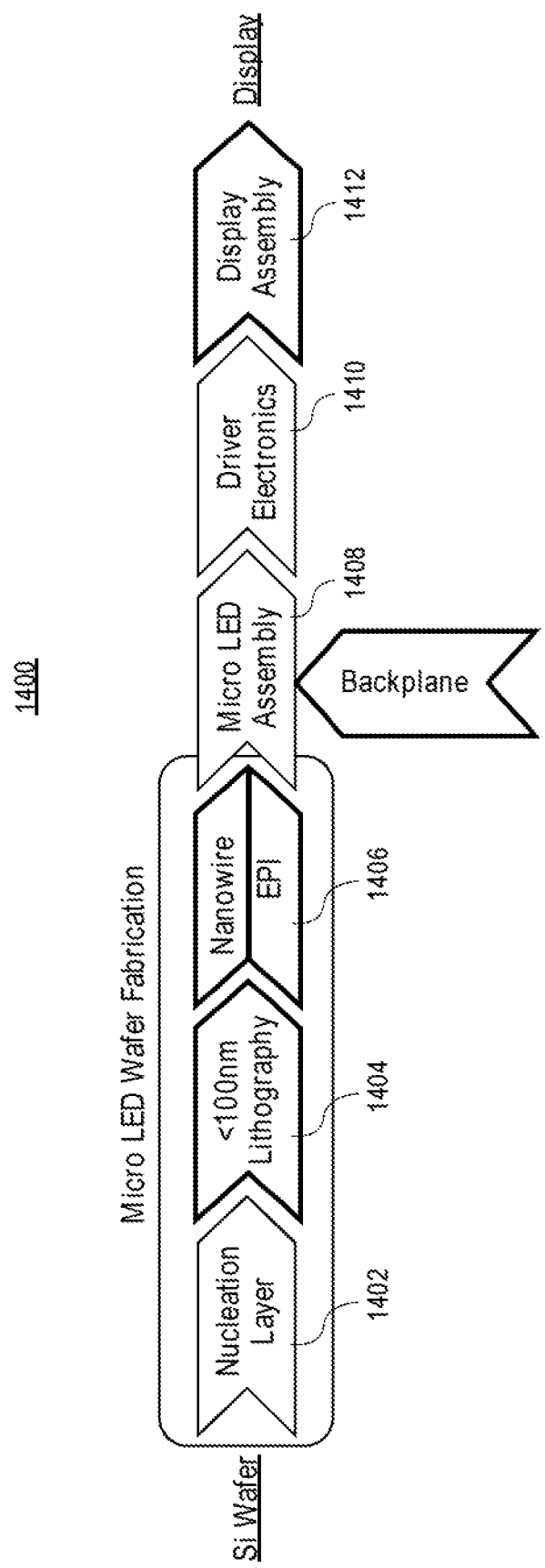
FIG. 14 is a flow diagram illustrating an RGB display production process, in accordance with an embodiment of the present disclosure.

In another aspect, FIG. 14 is a flow diagram 1400 illustrating an RGB display production process, in accordance with an embodiment of the present disclosure. Referring to flow diagram 1400, at operation 1402, an Si wafer has a nucleation layer formed thereon, such as a patterned conductive/dielectric nucleation layer. At operation 1404, sub 100 nm lithography is used to pattern a layer on the nucleation layer, or to pattern the nucleation layer. At operation 1406, nanowire growth is performed on the nucleation layer, e.g., by epitaxial deposition. At operation 1408, a backplane is introduced into the micro LED assembly process. At operation 810, driver electrons are fabricated. At operation 1412, display assembly is performed to finally provide a display.

Figure 15:
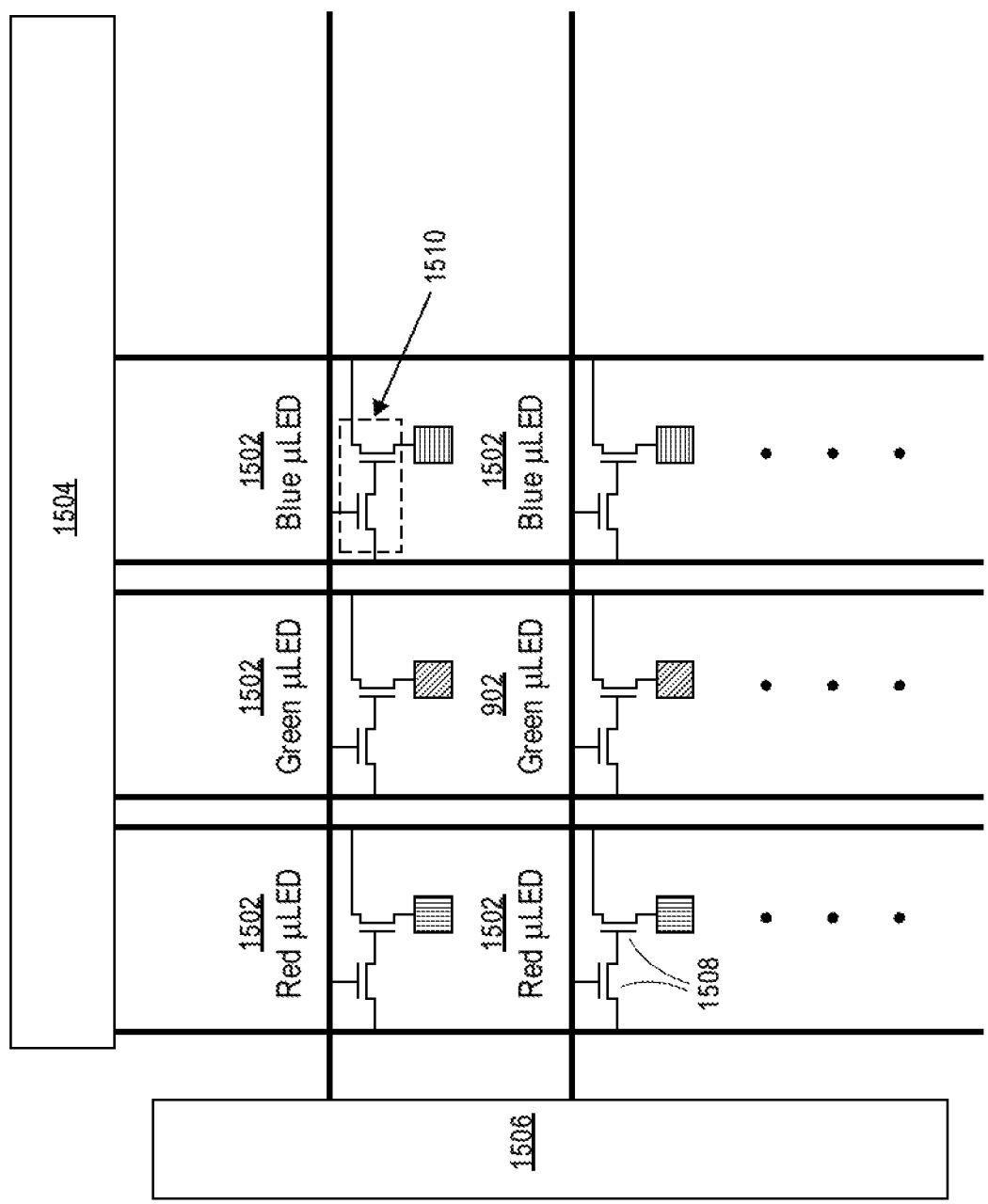
FIG. 15 is a schematic illustration of a display architecture, in accordance with an embodiment of the present disclosure.

FIG. 15 is a schematic illustration of a display architecture, in accordance with an embodiment of the present disclosure. Referring to FIG. 15, micro LEDs 1502 are arranged in a matrix. The micro LEDs are driven through "Data Driver" 1504 and "Scan Driver" 1506 chips. Thin film transistors 1508 are used to make "pixel driver circuits" 1510 for each micro LED. In an embodiment, the micro LEDs are fabricated on a silicon wafer then transferred to a glass substrate called "backplane" where the "pixel driver circuits" 1510 have been fabricated using thin film transistors. Although represented simplistically in FIG. 15, it is to be appreciated that the pixel driver circuits 1510 may be or include a driver circuit such as circuit 400 or circuit 600 described herein.

Figure 16:
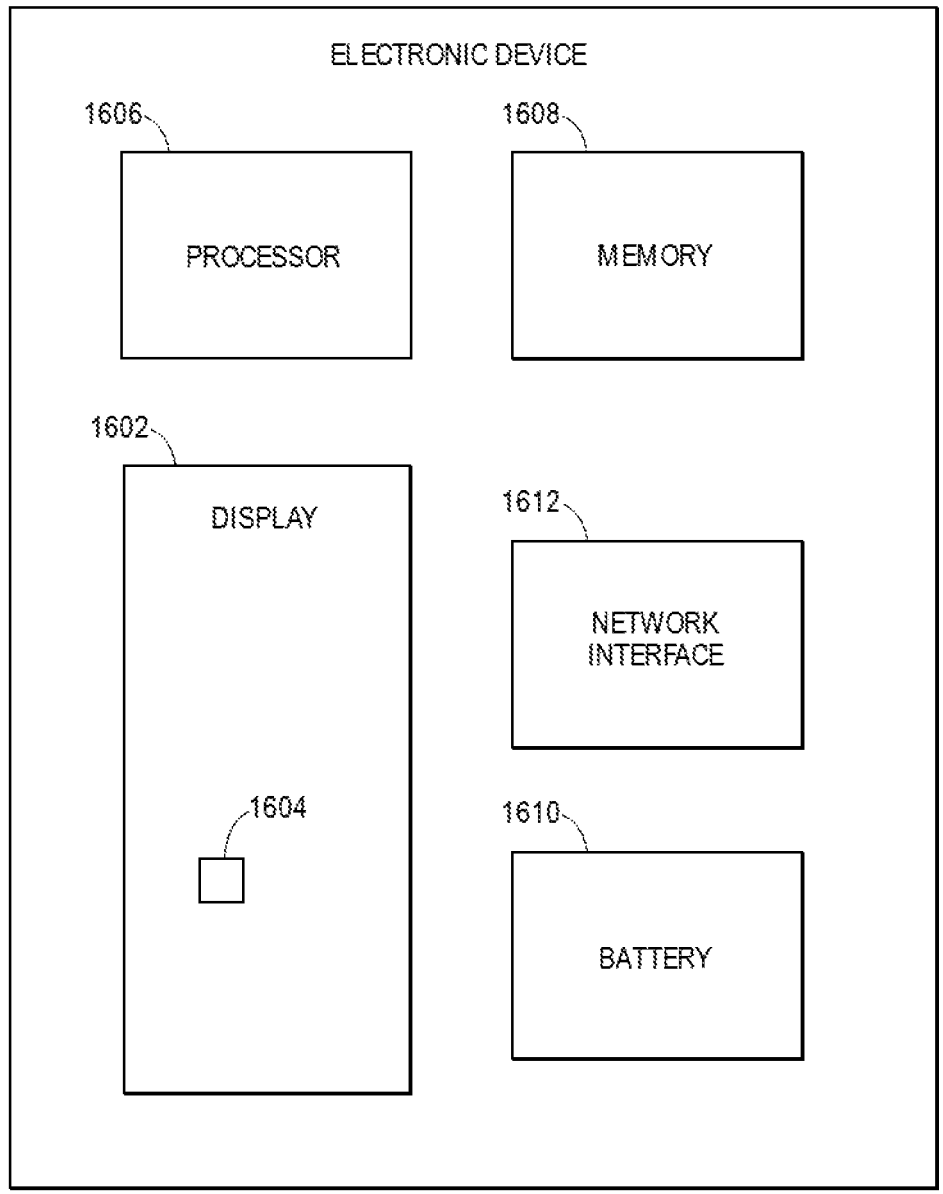
FIG. 16 is an electronic device having a display, in accordance with embodiments of the present disclosure.

FIG. 16 is an electronic device having a display, in accordance with embodiments of the present disclosure. Referring to FIG. 16, an electronic device 1600 has a display or display panel 1602 with a micro-structure 1604. The display may also have glass layers and other layers, circuitry, and so forth. The display panel 1602 may be a micro-LED display panel. As should be apparent, only one microstructure 1604 is depicted for clarity, though a display panel 1602 will have an array or arrays of microstructures including nanowire LEDs.

The electronic device 1600 may be a mobile device such as smartphone, tablet, notebook, smartwatch, and so forth. The electronic device 1600 may be a computing device, stand-alone display, television, display monitor, vehicle computer display, the like. Indeed, the electronic device 1600 may generally be any electronic device having a display or display panel.

The electronic device 1600 may include a processor 1606 (e.g., a central processing unit or CPU) and memory 1608. The memory 1608 may include volatile memory and non-volatile memory. The processor 1606 or other controller, along with executable code store in the memory 1608, may provide for touchscreen control of the display and well as for other features and actions of the electronic device 1600.

In addition, the electronic device 1600 may include a battery 1610 that powers the electronic device including the display panel 1602. The device 1600 may also include a network interface 1612 to provide for wired or wireless coupling of the electronic to a network or the internet. Wireless protocols may include Wi-Fi (e.g., via an access point or AP), Wireless Direct®, Bluetooth®, and the like. Lastly, as is apparent, the electronic device 1600 may include additional components including circuitry and other components.

Thus, embodiments described herein include micro light-emitting diode (LED) display driver architectures and pixel structures.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example Embodiment 1

A driver circuit for a micro light emitting diode device includes a current mirror. A linearized transconductance amplifier is coupled to the current mirror. The linearized transconductance amplifier is to generate a pulse amplitude modulated current.

Example Embodiment 2

The driver circuit of example embodiment 1, wherein the current mirror includes two P-type transistors.

Example Embodiment 3

The driver circuit of example embodiment 1, wherein the current mirror includes four N-type transistors.

Example Embodiment 4

The driver circuit of example embodiment 3, wherein the four N-type transistors are IGZO-based thin film transistors.

Example Embodiment 5

The driver circuit of example embodiment 1, 2, 3 or 4, wherein the linearized transconductance amplifier includes a digital to analog convertor to convert an input voltage to a current.

Example Embodiment 6

The driver circuit of example embodiment 5, wherein the linearized transconductance amplifier is to switch the current to the pulse amplitude modulated current.

Example Embodiment 7

The driver circuit of example embodiment 1, 2, 3, 4, 5 or 6, wherein a width of the pulse of the pulse amplitude modulated current is fixed by an amount of current density needed for representing a maximum Gray level.

Example Embodiment 8

A backplane of a micro light emitting diode pixel structure includes a glass substrate having an insulating layer disposed thereon. A plurality of pixel thin film transistor circuits is disposed in and on the insulating layer. Each of the pixel thin film transistor circuits includes a gate electrode and a channel including a semiconducting oxide material.

Example Embodiment 9

The backplane of example 8, wherein the semiconducting oxide material is indium gallium zinc oxide (IGZO).

Example Embodiment 10

The backplane of example embodiment 8 or 9, wherein each of the pixel thin film transistor circuits is to drive a single micro light emitting diode device.

Example Embodiment 11

The backplane of example embodiment 8, 9 or 10, wherein each of the pixel thin film transistor circuits includes a current mirror and a linearized transconductance amplifier coupled to the current mirror.

Example Embodiment 12

The backplane of example embodiment 11, wherein the current mirror of each of the pixel thin film transistor circuits includes four N-type transistors.

Example Embodiment 13

The backplane of example embodiment 11 or 12, wherein the linearized transconductance amplifier is to generate a pulse amplitude modulated current.

Example Embodiment 14

A front plane of a micro light emitting diode pixel structure includes a plurality of micro light emitting diode devices in a dielectric layer. A transparent conducting oxide layer is disposed above the dielectric layer. A mask layer is above the transparent conducting oxide layer. A plurality of microlenses is disposed in openings in the mask layer, individual ones of the plurality of microlenses over a corresponding one of the plurality of micro light emitting diode devices.

Example Embodiment 15

The front plane of example embodiment 14, wherein the plurality of microlenses includes regions of reflowed photoresist.

Example Embodiment 16

The front plane of example embodiment 14, wherein the plurality of microlenses includes regions of self-assembled microspheres.

Example Embodiment 17

The front plane of example embodiment 14, 15 or 16, wherein the dielectric layer is a carbon-doped oxide layer, the mask includes $CrO_2$, and the transparent conducting oxide layer is an indium tin oxide (ITO) layer.

Example Embodiment 18

The front plane of example embodiment 14, 15, 16 or 17, wherein the plurality of micro light emitting diode devices includes a single red micro light emitting diode device, a single green micro light emitting diode device, and a single blue micro light emitting diode device.

Example Embodiment 19

The front plane of example embodiment 14, 15, 16, 17 or 18, wherein the plurality of micro light emitting diode devices is a plurality of nanowire-based micro light emitting diode devices.

Example Embodiment 20

The front plane of example embodiment 19, wherein the plurality of nanowire-based micro light emitting diode devices includes GaN nanowires.

What is claimed is:

1. A driver circuit for a micro light emitting diode device, the driver circuit comprising:
    a current mirror; and
    a linearized transconductance amplifier coupled to the current mirror, the linearized transconductance amplifier to generate a pulse amplitude modulated current, wherein the current mirror comprises four N-type transistors, and wherein the four N-type transistors are IGZO-based thin film transistors.

2. The driver circuit of claim 1, wherein the linearized transconductance amplifier comprises a digital to analog convertor to convert an input voltage to a current.

3. The driver circuit of claim 2, wherein the linearized transconductance amplifier is to switch the current to the pulse amplitude modulated current.

4. The driver circuit of claim 1, wherein a width of the pulse of the pulse amplitude modulated current is fixed by an amount of current density needed for representing a maximum Gray level of a color of the micro light emitting diode device.

5. A driver circuit for a micro light emitting diode device, the driver circuit comprising:
    a current mirror; and
    a linearized transconductance amplifier coupled to the current mirror, the linearized transconductance amplifier to generate a pulse amplitude modulated current, wherein a width of the pulse of the pulse amplitude modulated current is fixed by an amount of current density needed for representing a maximum Gray level of a color of the micro light emitting diode device.

6. The driver circuit of claim 5, wherein the current mirror comprises two P-type transistors.

7. The driver circuit of claim 5, wherein the current mirror comprises four N-type transistors.

8. The driver circuit of claim 7, wherein the four N-type transistors are IGZO-based thin film transistors.

9. The driver circuit of claim 5, wherein the linearized transconductance amplifier comprises a digital to analog convertor to convert an input voltage to a current.

10. The driver circuit of claim 9, wherein the linearized transconductance amplifier is to switch the current to the pulse amplitude modulated current.

* * * * *